US012227842B2

(12) United States Patent
Lind et al.

(10) Patent No.: US 12,227,842 B2
(45) Date of Patent: Feb. 18, 2025

(54) VAPOR ACCUMULATOR FOR CORROSIVE GASES WITH PURGING

(71) Applicant: Lam Research Corporation, Fremont, CA (US)

(72) Inventors: Gary Bridger Lind, Penn Valley, CA (US); Panya Wongsenakhum, Santa Clara, CA (US); Joshua Collins, Sunnyvale, CA (US); Harald te Nijenhuis, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 480 days.

(21) Appl. No.: 17/595,504

(22) PCT Filed: May 19, 2020

(86) PCT No.: PCT/US2020/033653
§ 371 (c)(1),
(2) Date: Nov. 18, 2021

(87) PCT Pub. No.: WO2020/236844
PCT Pub. Date: Nov. 26, 2020

(65) Prior Publication Data
US 2022/0213599 A1 Jul. 7, 2022

Related U.S. Application Data

(60) Provisional application No. 62/851,462, filed on May 22, 2019.

(51) Int. Cl.
C23C 16/448 (2006.01)
C23C 16/455 (2006.01)
C23C 16/52 (2006.01)

(52) U.S. Cl.
CPC ...... *C23C 16/45544* (2013.01); *C23C 16/448* (2013.01); *C23C 16/45561* (2013.01); *C23C 16/52* (2013.01)

(58) Field of Classification Search
None
See application file for complete search history.

(56) References Cited

U.S. PATENT DOCUMENTS 5,062,386 A * 11/1991 Christensen ...... C23C 16/45574
118/724
5,207,573 A * 5/1993 Miyagi ...... C21D 1/34
432/152

(Continued)

FOREIGN PATENT DOCUMENTS

CN 101170036 B 6/2010
CN 102443784 A 5/2012

(Continued)

OTHER PUBLICATIONS

International Preliminary Report on Patentability dated Dec. 2, 2021, issued in PCT/US2020/033653.

(Continued)

*Primary Examiner* — Binu Thomas
(74) *Attorney, Agent, or Firm* — Weaver Austin Villeneuve & Sampson LLP

(57) ABSTRACT

Vapor accumulator reservoirs for semiconductor processing operations, such as atomic layer deposition operations, are provided. Such vapor accumulator reservoirs may include a perimeter plenum volume filled with an inert gas, which may reduce or prevent the leakage of external contaminants into a process gas. In some implementations, the reservoir may be constructed from corrosion-resistant materials to reduce internal contaminants into the process gas.

22 Claims, 7 Drawing Sheets

(56) References Cited

U.S. PATENT DOCUMENTS

| | | | | |
|---|---|---|---|---|
| 5,368,648 | A | * | 11/1994 | Sekizuka ............ C23C 16/4409 277/653 |
| 5,578,132 | A | * | 11/1996 | Yamaga ................ C23C 16/455 219/390 |
| 2002/0008009 | A1 | | 1/2002 | Lemme et al. |
| 2003/0075925 | A1 | * | 4/2003 | Lindfors ............. C23C 16/4409 285/367 |
| 2005/0109277 | A1 | | 5/2005 | Kobrin et al. |
| 2007/0087533 | A1 | * | 4/2007 | Nishikawa .......... C23C 16/4409 438/478 |
| 2011/0303361 | A1 | * | 12/2011 | Ohmi ................. C23C 16/4409 220/361 |
| 2012/0291696 | A1 | | 11/2012 | Clarke |
| 2017/0101710 | A1 | * | 4/2017 | Chandrasekharan ........................ C23C 16/4409 |
| 2017/0335450 | A1 | | 11/2017 | Collins et al. |
| 2017/0342562 | A1 | | 11/2017 | Lind et al. |
| 2021/0317577 | A1 | * | 10/2021 | Mustafa ................ C23C 16/458 |

FOREIGN PATENT DOCUMENTS

| | | |
|---|---|---|
| CN | 107452653 A | 12/2017 |
| JP | 2002509027 A | 3/2002 |
| JP | 2004140328 A | 5/2004 |
| JP | 2006515038 A | 5/2006 |
| KR | 100820360 B1 | 4/2008 |
| WO | WO-9936186 A1 | 7/1999 |

OTHER PUBLICATIONS

International Search Report and Written Opinion dated Aug. 28, 2020 in PCT Application PCT/US202/033653.

CN Office Action dated Feb. 28, 2024 in CN Application No. 202080051881.3 with English Translation.

JP Office Action dated Apr. 23, 2024 in JP Application No. 2021-568998, with English Translation.

JP Office Action dated Oct. 15, 2024 in JP Application No. 2021-568998 with English translation.

* cited by examiner

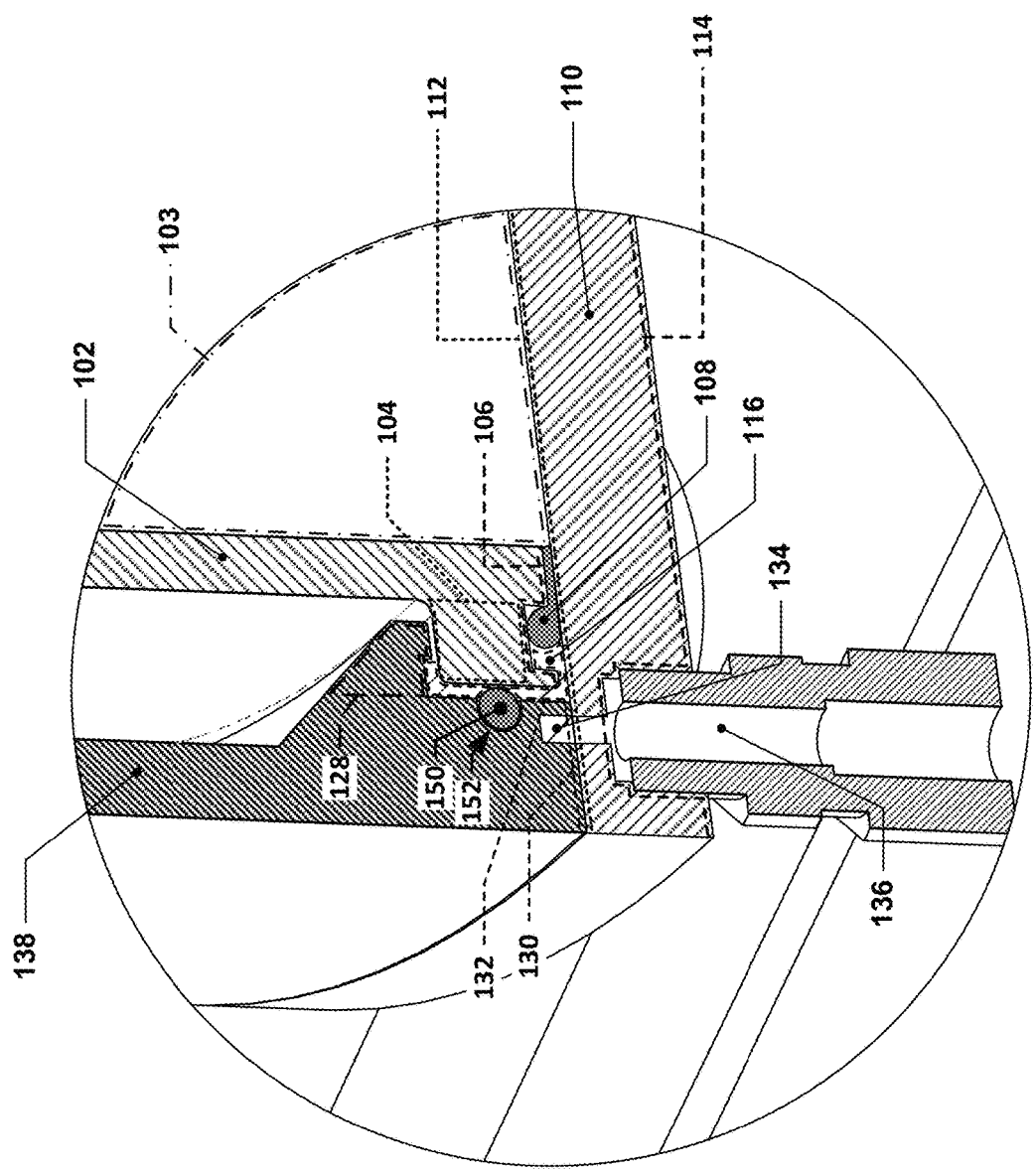
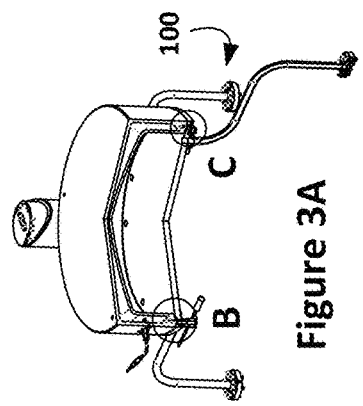
Figure 3B'
Figure 3A

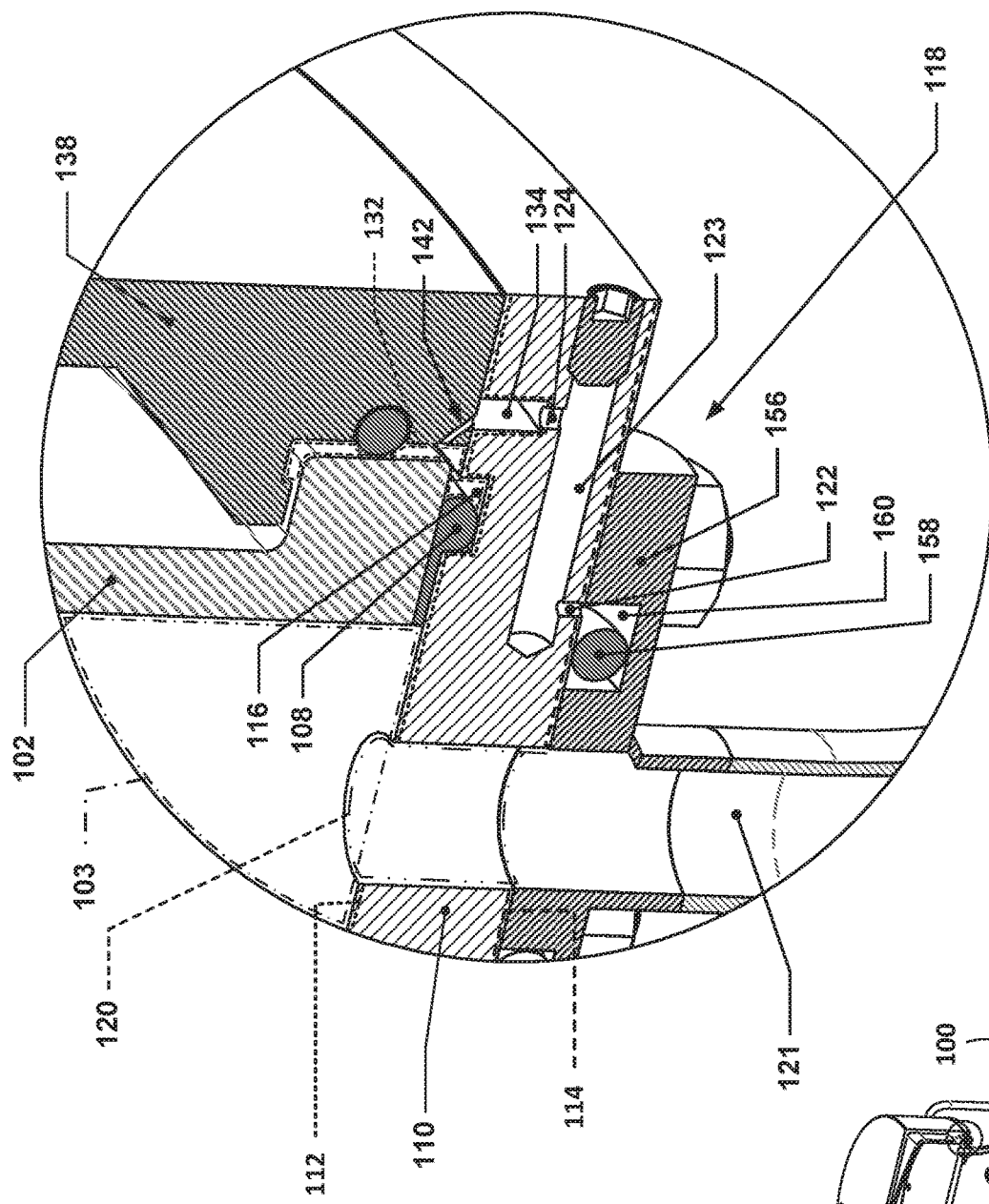
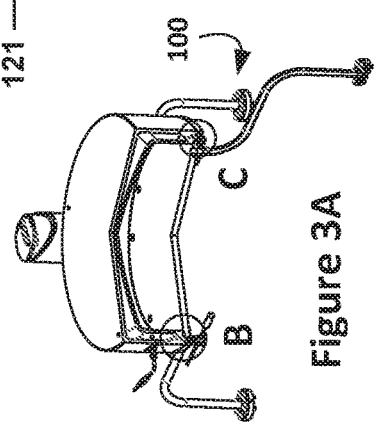
Figure 3C
Figure 3A

VAPOR ACCUMULATOR FOR CORROSIVE GASES WITH PURGING

INCORPORATED BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

During semiconductor processing operations, one or more reactants may be distributed across a semiconductor wafer in order to perform etching, deposition, cleaning, or other operations. In some such semiconductor operations, the reactant or reactants may be provided in a vaporized form that is suspended in a carrier gas, e.g., a gas that may be chemically inert or non-reactive with respect to the other reactants used, before being flowed across the semiconductor wafer.

A process gas may include the carrier gas and the vaporized reactants. Process gas distributed across the semiconductor wafer may come from an accumulator, which stores a large volume of the process gas, relative to the volume of the wafer processing area, at specific temperature and pressure ranges. An accumulator may store highly volatile, toxic, and/or reactive process gas during semiconductor processing prior to, during, and after distribution of portions of the process gas across one or more semiconductor wafers.

The present disclosure is directed at new techniques and apparatuses for improving the design and construction of accumulators in semiconductor processing chambers.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In one aspect of the implementations disclosed herein, an apparatus for use in a semiconductor processing tool may be provided. The apparatus may include a bell jar having a bottom opening, one or more flange structures arranged around the bottom opening and extending radially outward therefrom, and a seal surface; the apparatus may also include a main o-ring and a plate. The plate may have a first side and a second side opposite the first side, the bell jar may be positioned with the seal surface adjacent to the first side, a main o-ring groove may be located in the first side of the plate and/or the seal surface of the bell jar, the main o-ring may be positioned at least partially within the main o-ring groove and may be sandwiched between the seal surface of the bell jar and the first side of the plate, and the plate may include one or more fluidic seal interfaces. Each fluidic seal interface may include i) a port located inside of an interior perimeter of the main o-ring and extending through the plate from the first side to the second side and ii) at least one purge gas outlet located on the second side of the plate and fluidically connected, by a corresponding purge gas passage located within the plate, with a corresponding purge gas inlet located on the first side of the plate. The apparatus may further include one or more clamping structures having a bottom surface proximate to the first side of the plate and an interior flange extending radially inward therefrom and proximate to the one or more flange structures, as well as a perimeter plenum volume defined, at least in part, by the main o-ring, a portion of the main o-ring groove, a portion of the first side of the plate, a portion of the seal surface, and at least a portion of each of the one or more flange structures between the interior flange of the one or more clamping structures and the seal surface. The apparatus may also include one or more purge gallery grooves a) located in the plate and/or the one or more clamping structures, and b) arranged around the main o-ring groove; the one or more purge gallery grooves may be fluidically connected with the perimeter plenum volume and with each purge gas inlet within the apparatus, and a purge gas feed inlet may be fluidically connected with the one or more purge gallery grooves.

In some implementations the apparatus may further include a bell jar cover having a bottom opening and a bottom surface. The bottom surface of the bell jar cover may be proximate to the first side of the first plate, and the bell jar may be contained within a volume defined, at least in part, by the first side of the plate and an interior surface of the bell jar cover. The perimeter plenum volume may be additionally defined, at least in part, by the interior surface of the bell jar cover and an exterior surface of the bell jar.

In some implementations, the one or more clamping structures may be part of the bell jar cover, wherein the bottom surface of the one or more clamping structures is the bottom surface of the bell jar cover, and the interior flange of the one or more clamping structures is an interior flange of the bell jar cover.

In some implementations, the bell jar cover may have an inner edge of the bottom surface proximate to the first side of the plate, the one or more purge gallery grooves may be located outside of the inner edge, and the bell jar cover may have a plurality of purge gas ports connecting the one or more purge gallery grooves with the perimeter plenum volume. In some implementations, the plurality of purge gas ports may have a cross-sectional area less than about 10% of a cross-sectional area of the purge gallery groove in a plane that is perpendicular to a path followed by the purge gallery groove.

In some implementations, the one or more clamping structures may be provided by an interior flange that extends around the perimeter of the bottom opening of the bell jar cover. In some implementations, the apparatus may include one or more heating elements proximate to the second side of the plate. In some implementations, the apparatus may include one or more temperature sensor devices, each temperature sensor device in contact with the bell jar, the plate, or one of the one or more fluidic seal interfaces.

In some implementations, the one or more flange structures may be a single flange structure. In some implementations, the one or more clamping structures may be a single clamping structure. In some implementations, the one or more flange structures may be a single flange structure, and the apparatus may further include a secondary o-ring and a secondary o-ring groove located in the single flange structure and/or the single clamping structure, and the secondary o-ring may be positioned at least partially within the secondary o-ring groove and may be radially interposed between the single flange structure and the second surface of the single clamping structure.

In some implementations, there may be six fluidic seal interfaces. In some implementations, the main o-ring groove may be located in the plate. In some implementations, each fluidic seal interface may include a flange plate, an interface o-ring, and an interface o-ring groove located in the flange plate and/or the second side of the plate.

In some implementations, the apparatus may include a vapor accumulation volume defined, at least in part, by an interior surface of the bell jar, the main o-ring, and/or the first side of the plate.

In some implementations, the apparatus may further include a pump fluidically connected with the bell jar volume and a controller that includes one or more processors and one or more memory devices. The one or more processors, the one or more memory devices, and the pump may be operably connected with each other, and the one or more memory devices may store computer-executable instructions for controlling the one or more processors to cause the pump to reduce the absolute pressure in the bell jar volume to a level of less than 10 torr to 200 torr.

In some implementations, the purge gas feed inlet may be connected with a gas supply comprising an inert gas. In some implementations, the inert gas may include one or more of argon, helium, nitrogen, and neon. In some implementations, the apparatus may include a secondary o-ring positioned at least partially between the one or more flange structures and the one or more clamping structures.

In some implementations, the main o-ring may include a flat, annular section that extends radially inward from a toroidal section.

In some implementations, the apparatus may include a plurality of purge gas ports connecting the one or more purge gallery grooves with the perimeter plenum volume. Each of the plurality of purge gas ports may have a cross-sectional area less than about 10% of a cross-sectional area of the purge gallery groove in a plane that is perpendicular to a path followed by the purge gallery groove In some implementations, the one or more purge gallery grooves may be provided by a single purge gallery groove. In some implementations, the single purge gallery groove may form a complete loop around the main o-ring groove. In some implementations, one or more of the one or more fluidic seal interfaces may be connected with a gas supply source. In some implementations, one or more of the one or more fluidic seal interfaces are outlet interfaces for distributing gas.

In some implementations, the bell jar and/or the plate may be non-reactive to chlorine containing compounds. In some implementations, the bell jar and/or the plate may be non-reactive to fluorine containing compounds. In some implementations, the bell jar and the plate may each include one or more of the following materials: quartz ($SiO_2$), quartz with a sapphire ($Al_2O_3$) coating, quartz with an alumina ($Al_2O_3$) coating, quartz with a yttria ($Y_2O_3$) coating, quartz with a yttria-stabilized zirconia ($ZrO_2$) coating, quartz with a alumina/yttria laminate coating, borosilicate glass with a quartz coating, borosilicate glass with a sapphire coating, aluminum alloy, aluminum 6061 with an alumina coating, aluminum 7075 with an alumina coating, or aluminum 3003 with an alumina coating, aluminum alloy with a hard anodize ($Al_2O_3$) coating, aluminum 6061 with a hard anodize coating, aluminum 7075 with a hard anodize coating, or aluminum 3003 with a hard anodize coating, aluminum alloy with an electroless high phosphate nickel plating (NiP), aluminum 6061 with an electroless high phosphate nickel plating, aluminum 7075 with an electroless high phosphate nickel plating, or aluminum 3003 with an electroless high phosphate nickel plating, aluminum alloy with a polymer polytetrafluoroethylene (PTFE), perfluoroalkoxy (PFA), or parylene coating, aluminum 6061 with a polymer polytetrafluoroethylene, perfluoroalkoxy, or parylene coating, aluminum 7075 with a polymer polytetrafluoroethylene, perfluoroalkoxy, or parylene coating, or aluminum 3003 with a polymer polytetrafluoroethylene, perfluoroalkoxy, or parylene coating, stainless steel alloy with a electroless high phosphate nickel plating, stainless 316 with a electroless high phosphate nickel plating, or stainless 304 with a electroless high phosphate nickel plating, stainless steel alloy with a polymer, PTFE, PFA, or parylene coating, stainless 316 with a polymer, PTFE, PFA, or parylene coating, or stainless 304 with a polymer, PTFE, PFA, or parylene coating, corrosion resistant Ni-alloys, Hastelloy C-22, Hastelloy C-276, Hastelloy B-2, or Inconel 718.

These and other features of the disclosed implementations will be described in detail below with reference to the associated drawings.

BRIEF DESCRIPTION OF DRAWINGS

The various implementations disclosed herein are illustrated by way of example, and not by way of limitation, in the figures of the accompanying drawings, in which like reference numerals refer to similar elements.

FIGS. 3A-C depict cutaway views of the example vapor accumulator reservoir.

FIGS. 1 through 5 are to-scale within each Figure, except for FIGS. 3B and 3C, which are enlarged views of portions of FIG. 3A. The Figures may not be to-scale with each other.

DETAILED DESCRIPTION

Figure 1:
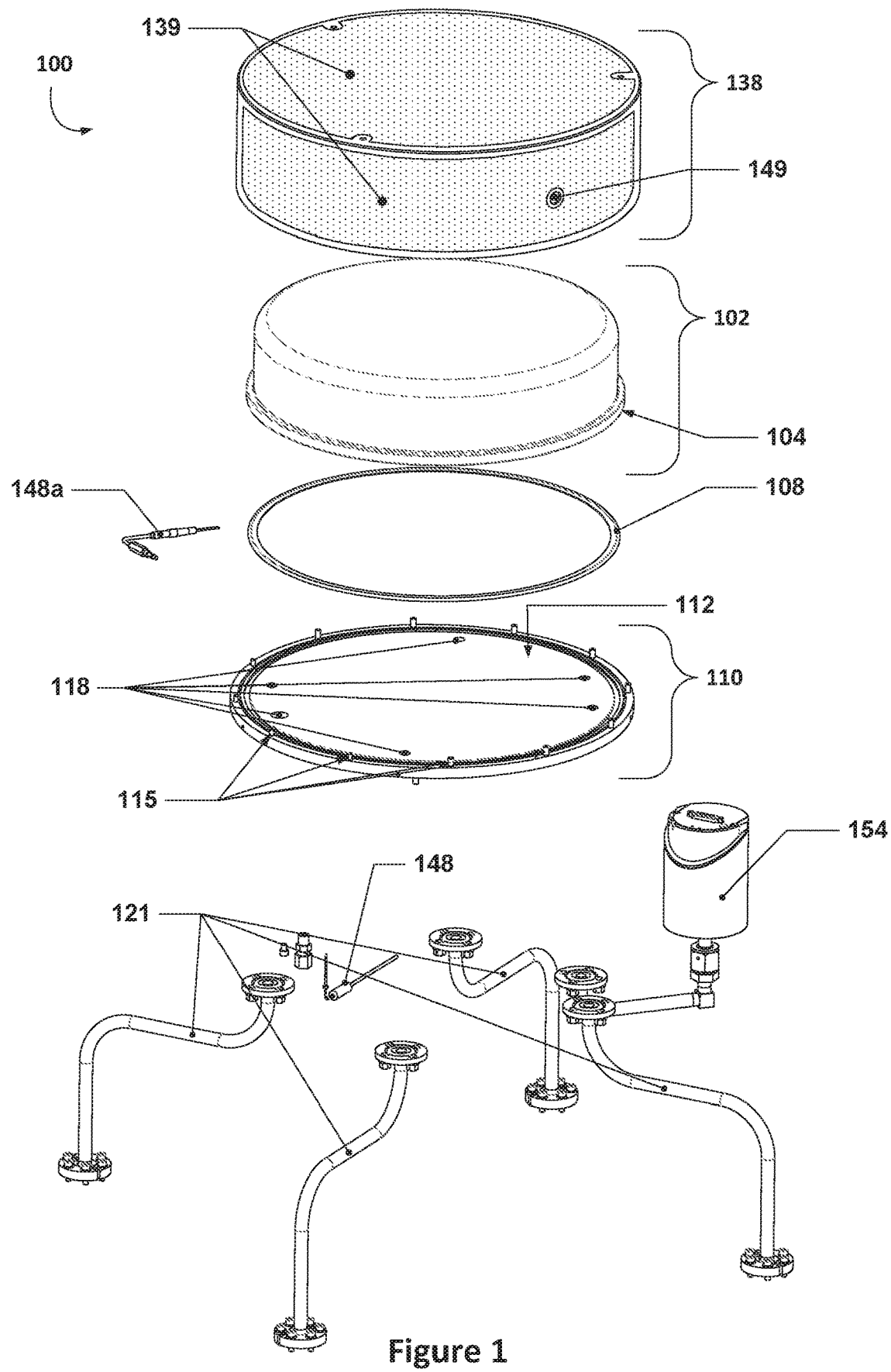
FIG. 1 depicts an exploded view of an example vapor accumulator reservoir as discussed herein.

In the following description, numerous specific details are set forth to provide a thorough understanding of the presented implementations. Implementations disclosed herein may be practiced without some or all of these specific details. Further, while the disclosed implementations will be described in conjunction with specific implementations, it will be understood that the specific implementations are not intended to limit the disclosed implementations.

Disclosed herein are methods, techniques, systems, and apparatuses for delivering vaporized precursors or other reactants to one or more semiconductor processing chambers. The concepts disclosed herein may be particularly applicable in cyclic, multi-phase semiconductor processing operations, such as ALD or ALE processes, and may also be well-suited for use in single- or multi-station semiconductor processing tools, i.e., tools where multiple semiconductor wafers may be processed simultaneously in the same chamber or in separate chambers sharing one or more tool subsystems, e.g., a controller, gas distribution system, vacuum pumping system, etc. The concepts disclosed herein may also be implemented in scenarios where there are no cyclic, multi-phase semiconductor processing operations involved and/or in single-station semiconductor processing tools, if desired.

The present inventors recognized that existing semiconductor processing systems, e.g., such as those used to perform ALD operations, may provide undesirable performance in some respects. For example, many ALD systems utilize a mass flow controller (MFC) to control the flow rate of a precursor to a semiconductor wafer that is being subjected to ALD processing. However, ALD precursor dosing cycles are actually quite short, e.g., on the order of less than a second or generally no more than 2-3 seconds. MFCs, by contrast, have very slow reaction times, e.g., longer than the precursor dosing time. Accordingly, ALD systems that use MFCs to regulate precursor dosing will typically include a divert or shunt valve downstream of the MFC—the precursor flow may thus be delivered either to the processing chamber, where it is flowed across the semiconductor wafer, or diverted into an exhaust system. The flow rate of the precursor through the MFC may be maintained at a relatively steady state, regardless of to which destination the precursor is ultimately delivered. In such systems, the amount of precursor that is delivered to the processing chamber is controlled by actuating the divert valve (which has a much quicker reaction time than the MFC) at times based on the mass flow rate provided by the MFC. This solution, however, is very wasteful, as the precursor must be flowed through the MFC continuously and the precursor that is not delivered to the semiconductor wafer must therefore be diverted into the exhaust system, where it is wasted. MFCs are also expensive components, and in multi-station semiconductor processing tools, each station would require its own MFC and divert valve for such purposes.

Multi-station ALD tools may use pulsed deposition of a low-vapor pressure precursor to the semiconductor wafers being processed in the tool. Such a tool, for example, may utilize a precursor like tungsten pentachloride or tungsten hexachloride, which may be suspended in vaporized form in an inert or otherwise non-reactive carrier gas. Rather than utilize the conventional MFC/divert valve approach, supplying the vaporized precursor to a relatively large vapor accumulator reservoir and then metering out small amounts of vaporized precursor to one or more processing chambers, as needed, is more efficient. Such a vapor accumulator reservoir may be supplied vaporized precursor from one or more vaporizers via a vapor inlet and be connected to one or more processing chambers by corresponding vapor delivery lines. It is to be understood that the vapor accumulator reservoirs discussed herein are not to be confused with the working volumes of vaporizers themselves, i.e., where the vaporization of a solid or liquid phase actually takes place (the transition of a solid phase to a gaseous phase is technically referred to as sublimation, but for the purposes of this application, the term "vaporization" or the like are to be understood to refer to the transition of a solid or a liquid phase material into a gaseous phase). A vapor accumulator reservoir, as the term is used herein, refers to a reservoir that receives vapor that is already entrained in a carrier gas but does not, itself, contain a solid- or liquid-phase substance that is to be evaporated. For example, a liquid or solid precursor may be housed in an ampoule with a volume; the precursor may be caused to evaporate within that ampoule volume, thereby creating a vapor—this vapor may then be delivered downstream to the vapor accumulator reservoir by a tube, pipe, or other relatively small cross-sectional flow area conduit (compared to the cross-sectional flow area of the ampoule itself)—the ampoule itself would not be considered to be a vapor accumulator reservoir since it contains the solid or liquid-phase reactant that is to be evaporated. Examples of some vaporizers that may be used in the implementations discussed herein may be found in U.S. Pat. No. 10,087,523, which issued on Oct. 2, 2018, and is hereby incorporated by reference herein in its entirety.

The flow of vaporized precursor from the vapor accumulator reservoir to each individual processing chamber may be regulated by a corresponding valve, which may be actuated so as to deliver very short pulses, e.g., pulse widths of several seconds, 500 ms or less, 50 ms or less, etc., of vaporized precursor to that processing chamber. The volume of the vapor accumulator reservoir may be sized such that it contains enough precursor that providing a single precursor dose from the vapor accumulator reservoir to any one of the processing chambers to which it may be connected does not negatively affect the ability of the vapor accumulator reservoir to simultaneously deliver accurate doses to the other processing chambers to which it is connected (although during processing, such doses may also be delivered asynchronously).

In order to maintain the precursor in a vapor state, allow for accurate dosing, and be pressure-compatible with the pressure in the processing chamber, the vapor accumulator reservoir may be held at a relatively low pressure, e.g., a medium vacuum, between about 10 torr and about 200 torr, between about 10 torr and about 20 torr, or between about 50 torr and about 200 torr. Generally, the pressure of the vapor accumulator reservoir will be at least about twice the pressure in the processing chamber during processing operations. Thus, the amount of gas (both vaporized precursor and carrier gas) that is resident in the vapor accumulator reservoir may be quite volumetrically dilute. A pump may be fluidically connected with the vapor accumulator reservoir, which may be controlled to reduce the pressure in the vapor accumulator reservoir.

In some implementations, the process gases that are stored in the vapor accumulator reservoir may be chlorinated precursors or oxychlorides, including tungsten hexachloride, tungsten pentachloride, tungsten oxytetrachloride, tungsten dichloride dioxide, molybdenum pentachloride, molybdenum oxytetrachloride, molybdenum dichloride dioxide, and titanium tetrachloride. In some implementations, the process gases are fluorinated precursors or oxyfluorides, including tungsten hexafluoride, tungsten pentafluoride, tungsten oxytetrafluoride, tungsten difluoride dioxide, molybdenum pentafluoride, molybdenum oxytetrafluoride, molybdenum difluoride dioxide, and titanium tetrafluoride. In some implementations, the process gas may follow the general formula of either $MeCl_x$, $MeO_yCl_x$, $MeF_x$, and/or $MeO_yF_x$, where Me stands for: titanium (Ti), tungsten (W), molybdenum (Mo), ruthenium (Ru), niobium (Nb) and/or rhodium (Rh), and x and y are both greater than or equal to 1. In some implementations, brominated and iodinated precursors may be used, following the general formula of either $MeHal_x$ (iso $MeO_yHal_x$) and/or $MeO_yHal_x$, where Hal stands for: chlorine, fluorine, bromine, and/or iodine.

Vapor accumulator reservoirs such as are discussed herein may be designed so as to have generally two major parts that define the volume within the vapor accumulator reservoir: a bell jar and a plate that seals the bottom of the bell jar. The bell jar, for example, may define one or more three-dimensional interior surfaces of the volume within the vapor accumulator reservoir, while the plate may generally define a nominally planar, e.g., generally two-dimensional, surface, of the volume within the vapor accumulator reservoir. It will be understood that the plate and bell jar structures discussed herein, or the functionality provided thereby, may be provided in a number of ways, including with assemblies in which the plate and/or the bell jar may be assemblies of other components. For example, the bell jar may be provided as an assembly of a cylindrical portion and a domed cap portion that, when assembled, provide a similar interior volume to that of the single-piece bell jar discussed herein.

The process gases flowed to and from a vapor accumulator reservoir may corrode it, which introduces contaminants and particles and is thus undesirable. Corrosion-resistant materials may be chosen for the construction of the vapor accumulator reservoir to reduce the amount of contamination and reduce the frequency of part replacement. Some corrosion resistant materials, such as ceramics or quartz, are less expensive than metal alloys such as Hastelloy, but are also harder to machine. Thus, in some implementations, some parts of the vapor accumulator reservoir, such as the plate, may include a metal alloy that is machined, while the bell jar that seals against the plate may require less machining and may include a ceramic.

The seal between the bell jar and the plate may not be completely leak-proof. As the vapor accumulator reservoir is typically held at a pressure less than atmospheric, a leak would introduce air into the process gas, which may result in contaminants, such as water vapor, or other particles entering the process gas flow and thereby potentially contaminating the wafers being processed. One solution is to enclose the process gas volume within a perimeter plenum volume of inert gas (also called purge gas) that if held at a greater pressure than the process gas volume, such that any leak between the perimeter plenum volume and the process gas volume will result in inert gas mixing with the process gas, which will not result in detrimental contamination. Furthermore, in some implementations, the perimeter plenum volume has a pressure greater than one atmosphere, such that any leak between the perimeter plenum volume and the atmosphere will result in inert gas flowing into the air surrounding the vapor accumulator reservoir rather than the reverse. This may provide an additional lay of protection against contaminants mixing with the process gas. In some implementations, the inert gas is one or more of argon, helium, nitrogen, or neon. In some implementations, a gas supply of inert gas may connect with the perimeter plenum volume using a valve that is configured to regulate the flow of inert gas and the pressure within the perimeter plenum volume.

FIG. 1 presents an exploded view of a vapor accumulator reservoir 100 according to some implementations. As discussed earlier, the vapor accumulator reservoir 100 includes a bell jar 102 and a plate 110 that may, between them, generally define the internal volume of the vapor accumulator reservoir 100. The bell jar 102 and the plate 110 may be assembled with a main o-ring 108 sandwiched in between them to provide a generally gas-tight seal at the interface between the two components. In some implementations, a bell jar cover 138 may be provided that may attach to the plate 110 and may serve to provide a protective shield over the bell jar 102. The bell jar cover 138 may, for example, be made from aluminum, stainless steel, or other relatively durable material so as to provide impact protection to the bell jar 102, which may, in some implementations, be made from a relatively brittle material, such as quartz or ceramic. The bell jar cover 138 may also, in some implementations, be integrated with a clamping structure that may be used to retain the bell jar 102 in place relative to the plate 110. In the depicted implementation, the bell jar 102 has an exterior flange 104 (visible in more detail in later Figures) and the bell jar cover 138 has an internal flange that overlaps with the exterior flange of the bell jar 102, when viewed along an axis normal to the plate 110. The bell jar cover 138 may, for example, be bolted to the plate 110 with a plurality of fasteners, e.g., screws, or other mounting system, and the exterior flange of the bell jar 102 may thus be trapped between the interior flange of the bell jar cover 138 and the plate 110. For bell jars 102 made of relatively brittle materials, such as quartz or ceramic, such an arrangement may be configured to avoid compressing, or only lightly compress, the exterior flange on the bell jar 102 to avoid potentially overstressing the exterior flange of the bell jar 102 and causing the bell jar 102 to potentially crack and fail. Such a clamping arrangement may serve to hold the bell jar 102 generally in place, thereby ensuring that when the pressure within the bell jar 102 is reduced, e.g., through using a pump, the exterior pressure on the bell jar 102 imparted by atmospheric/ambient air will cause the bell jar 102 to compress against the main o-ring 108, thereby generally sealing the volume within the bell jar 102.

The plate 110 may serve as the primary interface for inlets and outlets to the internal volume of the vapor accumulator reservoir 100, and may have a first side 112 which is exposed to the interior of the reservoir volume, as well as a second side opposite the first side that connects with vapor delivery lines 121. The plate also has connective features 115, e.g., threaded studs or through-holes for threaded fasteners, that may be used to connect the plate 110 with the bell jar cover 138, although other fastening systems may be used as well, e.g., bayonet-style mounts, threaded collars, etc., to join the bell jar cover 138 to the plate 110. The main o-ring 108 may fit into a main o-ring groove of the plate 110, although the main o-ring groove may, in some implementations, alternatively or additionally be located in the face of the bell jar 102 that mates against the main o-ring 108.

The vapor delivery lines 121 may be provided to deliver process gas from the internal volume of the vapor accumulator reservoir 100 to each station (not shown), e.g., via a showerhead or other gas distribution station located at each station, of a semiconductor processing tool. The vapor delivery lines 121 may fluidically connect with the vapor accumulator reservoir 100 using, for example, fluidic seal interfaces 118 of plate 110. The fluidic seal interfaces 118 may generally each include a through-hole in the plate 110, extending from the first side 112 of the plate 110 to the second side of the plate 110, through which gas may transit to or from the vapor accumulator reservoir volume, as well as features, e.g., threaded studs protruding from the second side of the plate 110 or blind threaded holes in the second side of the plate 110 for receiving screws or bolts, for mounting the vapor delivery lines 121 to the plate 110. The fluidic seal interfaces 118 may be designed to interface with a sealing component such as an o-ring. In some implementations, an additional feature for accommodating the sealing component may be included in the fluidic seal interfaces, e.g., an annular groove for receiving an o-ring may be provided on the second side of the plate 110 around the through-hole of a fluidic seal interface 118, although such a feature may additionally or alternatively be included in, for example, a flange plate or plates of the vapor delivery lines 121 or similar components. In some implementations, the fluidic seal interfaces may be located on the top or the side of the vapor accumulator reservoir, in addition to, or in the alternative to, the bottom. In such implementations, the through-hole may be located on the top or side of the vapor accumulator reservoir.

In some implementations, there may be a vapor concentration sensor 154 that monitors the vapor accumulation volume 103, e.g., to sample the gas within the vapor accumulation volume 103. The vapor concentration sensor 154 may be used to determine the pressure, relative concentrations, or temperature of process gases within the vapor accumulation volume 103. This information may then be used by a controller to adjust parameters of the operation of the vapor accumulator reservoir. The vapor concentration sensor may be fluidically connected to the vapor accumulation volume 103 using a fluidic seal interface in the same manner as the vapor delivery lines 121.

In some implementations, there may also be a divert line (not shown) that can be used to flow gas through the vapor accumulator volume 103 without distributing gas to each station. A divert line may be fluidically connected to the vapor accumulation volume 103 using a fluidic seal interface in the same manner as the vapor delivery lines 121. The divert line may also be used to connect a pump to the vapor accumulation volume.

In some implementations, one or more heating elements 139, e.g., resistive heating pads or blankets, may be positioned on or around the bell jar cover 138. The heating elements may be used to maintain a consistent temperature of the vapor accumulator reservoir 100, which in some implementations may vary between 130° C. and 200° C. during operation. In some implementations, there may be no bell jar cover, e.g., such as if the bell jar 102 is made of stainless steel or other material that is not as susceptible to brittle failure, and in such implementations the heating elements may be placed directly on the bell jar itself, if desired. In some implementations, the heating element or an additional heating element may be placed proximate to the second side of the plate 110.

In some implementations, the vapor accumulator reservoir may include one or more thermocouples 148 that may contact with the plate and/or the bell jar. For example, a thermocouple 148a may contact with the bell jar through a sensor port 149 in the bell jar cover; the thermocouples 148 may have spring-loaded thermally sensitive tips so as to allow the thermocouple body to be mounted in the plate 110 and/or bell jar cover 138 while still allowing the tips of the thermocouples 148 to press against the surface to be monitored to provide good thermal contact. In some implementations, additional thermocouples may be connected with one or more of the vapor delivery lines 121 (not shown), e.g., an additional thermocouple may be configured to contact with the exterior surface of each vapor delivery line 121 to monitor the temperature of each such vapor delivery line. In some implementations, rather than a thermocouple, a different temperature sensor device may be used to measure the temperature of various components.

Figure 2:
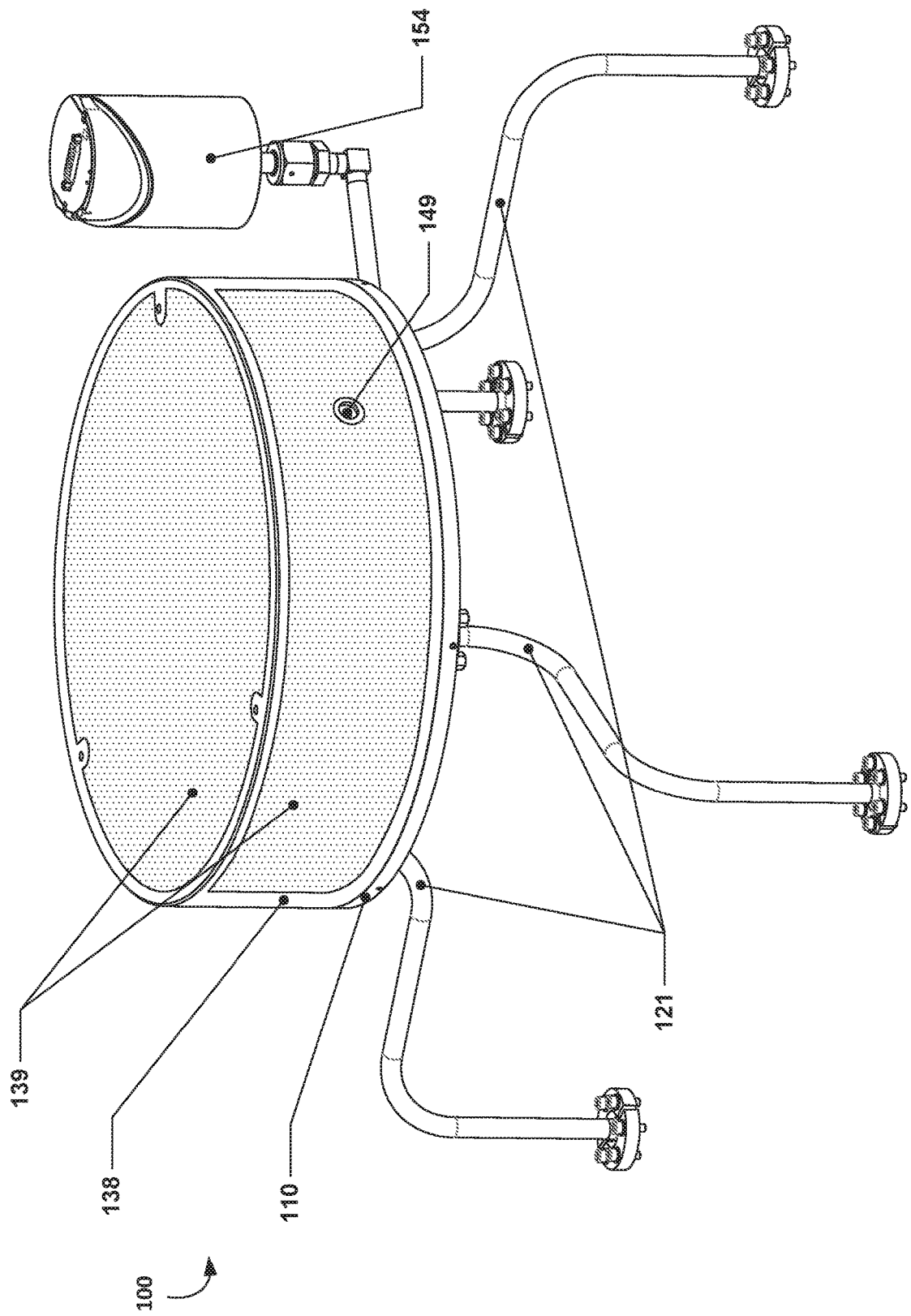
FIG. 2 depicts an assembled view of the example vapor accumulator reservoir.

FIG. 2 presents a view of the vapor accumulator reservoir 100 of FIG. 1 in an assembled, non-exploded state. As can be seen, the bell jar cover 138 and the plate 110 encapsulate the bell jar and the main o-ring (not shown). Vapor delivery lines 121 can be seen coming from the bottom of the plate 110, as well as the vapor concentration sensor 154.

The vapor accumulator reservoir 100 may be substantially circular in shape, as shown. It is to be understood that other shapes and configurations of the vapor accumulator reservoir 100 may be used as well.

FIGS. 3A-C present a cutaway view of the vapor accumulator reservoir 100 as well as focused detail views of the cutaway portion according to some implementations. FIG. 3B represents a detail view of a cutaway portion of the left side of the vapor accumulator reservoir 100 as shown in FIG. 3A, whereas FIG. 3C is a second view of a different cutaway portion of the right side of the vapor accumulator reservoir 100 shown in FIG. 3A.

In FIG. 3B, a cutaway view of the vapor accumulator reservoir 100 is shown with the plate 110 having a first side 112 and a second side 114, which are respectively represented by dashed lines. The first side 112 of the plate 110 may have a main o-ring groove 116 and a main o-ring 108 positioned at least partially in the main o-ring groove 116. In some implementations, the main o-ring 108 may be entirely within the main o-ring groove 116. The main o-ring 108 is positioned between the plate 110 and a sealing surface 106 of the bell jar 102, forming a vapor accumulation volume 103 defined by at least the plate 110, the main o-ring 108, and the bell jar 102. In some implementations, the main o-ring may have a flat section that extends radially inward from a toroidal section and is positioned between the plate 110 and the sealing surface 106. This may help reduce pressure on the toroidal section of the main o-ring 108 and improve the quality and lifetime of the seal. In some implementations, the main o-ring groove 116 may be located in the plate 110, while, in other implementations, the main o-ring groove may be located in the bell jar 102. In some implementations, the main o-ring groove may be located partially within both the plate 110 and the bell jar 102. FIG. 3B' presents a cutaway view of the vapor accumulator reservoir 100 wherein the main o-ring groove is located in the bell jar 102.

The bell jar 102 may also have an exterior flange 104 that extends around the perimeter of the bell jar 102. While in the depicted implementations, the bell jar 102 has an annular exterior flange 104 that forms a single flange structure that extends around the circumference of the entire bell jar 102, in other implementations, the exterior flange 104 may include a plurality of flange structures spaced about the outer circumference of the bell jar 102. The exterior flange 104 is proximate to the interior flange 128 of the bell jar cover 138. In some implementations, the interior and exterior flanges may be designed to have a small gap between them, e.g., approximately 0.010 inches, when the bell jar cover 138 is in contact with the plate 110 to prevent over-clamping of the interior flange 128 on the exterior flange 104.

The bell jar cover 138 may also have a bottom surface 130 that contacts the plate 110. The bell jar cover 138 and the plate 110 may be connected using any of a variety of known methods; in the depicted example, the plate 110 has a circular array of holes through it and the bottom surface 130 of the bell jar cover 138 has a matching pattern of blind threaded holes in, allowing screws to be threaded into the bell jar cover 138 to clamp the bell jar cover 138 to the plate 110. In other implementations, the bell jar cover 138 and the plate 110 may be connected using other mechanisms.

In some implementations, a secondary o-ring 150 may be positioned along an interior surface of the bell jar cover 138 between the interior flange 128 and the bottom surface 130. In some implementations, the secondary o-ring 150 may be positioned between the exterior flange 104 of the bell jar and an interior surface of the bell jar cover 138, as shown in FIG. 3B. In such implementations, the bell jar cover 138 may have a secondary o-ring groove 152 in the interior surface thereof that may house the secondary o-ring 150 such that the secondary o-ring 150 is positioned partially within the interior surface of the bell jar cover 138. In some such implementations, the secondary o-ring 150 may be sized so that the secondary o-ring 150 does not form a gas or liquid-tight seal between the bell jar cover 138 and the bell jar 102; in such implementations, the secondary o-ring 150 may instead act as an elastomeric bumper that acts to center the bell jar 102 relative to the bell jar cover 138 and the plate 110 as well as to cushion potential impacts between the bell jar 102 and the bell jar cover 138. In some implementations, the secondary o-ring groove 152 may be located in the outermost surface of the bell jar 102 instead of in the bell jar cover 138.

As discussed earlier, in some implementations, there may be no bell jar cover 138 at all. For example, while the implementation shown in FIG. 1 includes a bell jar cover 138 that includes a clamping structure in the form of interior flange 126 in it, other implementations may omit the bell jar cover 138 and may instead utilize a clamping ring that extends around the bell jar 102 (similar to the portion of the bell jar cover 138 that includes the clamping structure shown but without the cylindrical wall and domed top of the bell jar cover 138). In such implementations, an o-ring may be placed in between the bottom surface of the interior flange 128 and the upper surface of the exterior flange 104 in order to avoid directly clamping on the exterior flange 104 with the interior flange 128 and to also provide at least a partially gas-tight seal. In yet other implementations, the clamping structure or structures used to hold the bell jar 102 in place may be separate from the bell jar cover 138, e.g., the bell jar 102 may be clamped in place on the plate 110 using a plurality of cleats around the perimeter of the exterior flange 104, and the bell jar cover 138 then fastened to the plate 110 so as to cover the bell jar 102 and the cleat clamping structures.

Regardless of whether or not there is a bell jar cover, implementations of the vapor accumulation reservoirs discussed herein may include a perimeter plenum volume 132 defined, at least in part, by the main o-ring 108, the main o-ring groove 116, and the first side 112. The perimeter plenum volume 132 may generally be an enclosed volume that may be pressurized with gas, e.g., an inert gas, in order to displace any ambient atmospheric air that may otherwise potentially come into contact with the main o-ring 108 and thus be at risk of being drawn past the main o-ring 108 into the vapor accumulation volume 103. In some implementations, the perimeter plenum volume may be additionally defined by the interior surface of the bell jar cover 138, e.g., the interior surface of the bell jar cover 138 in between the bottom surface 130 and the interior flange 128. In some implementations, the perimeter plenum volume may be additionally defined by the interior flange 128 of the one or more clamping structures.

The vapor accumulation reservoirs discussed herein may also include a purge gallery groove 134 that may be located in the plate 110. In some implementations, there may be a single purge gallery groove that extends around the perimeter of the plate. In some implementations, there may be one or more purge gallery grooves that are non-continuous and that partially extend around the perimeter of the plate. In some implementations, the purge gallery groove 134 may be located in just the first side 112 of the plate 110, while in other implementations the purge gallery groove may be located in one or both of the bottom surface 130 of the bell jar cover 138 (or the clamping structure if there is no bell jar cover) and the first side 112 of the plate 110. FIG. 3B' presents a cutaway view of the vapor accumulator reservoir 100 wherein the purge gallery groove is located in the bell jar cover 138.

In some implementations, one or more purge gas feed inlets 136 may be included in the second side 114 of the plate 110; each such purge gas feed inlet may connect with a purge gallery groove 134. The purge gas feed inlet(s) may be connectable to a purge gas supply and configured to allow purge gas to flow into the purge gallery groove(s) 134. In some implementations, there may be multiple purge gas feed inlets connected with the one or more purge gallery grooves. The purge gallery groove(s) may allow purge gas (or other gas that is functionally inert or non-reactive with respect to the process gas contained within the vapor accumulator reservoir 100) to be distributed to locations encircling the main o-ring 108.

FIG. 3C is a second view of a different cutaway portion of the vapor accumulator reservoir 100 shown in FIG. 3A. FIG. 3C shows the purge gallery groove 134, which in the implementation shown is the same as the purge gallery groove 134 shown in FIG. 3B as the purge gallery groove 134 is an annular groove, but in some implementations may be a different purge gallery groove, e.g., if two C-shaped purge gallery grooves are used, each provided purge gas by a corresponding purge gas feed inlet 136. In some implementations, the perimeter plenum volume 132 and the purge gallery groove 134 (which may also simply be referred to herein as a "purge gallery") may generally be a single, cohesive volume, e.g., the perimeter plenum volume 132 and the purge gallery groove 134 may be fluidically connected with one another around most of, or the entirety of, the circumference of the bell jar 102.

In other implementations, however, the perimeter plenum volume 132 and the purge gallery groove 134 may only be deliberately fluidically connected at discrete locations along the circumference of the bell jar 102, as is shown in FIG. 3C. For example, a plurality of purge gas ports 142 may be provided at locations spaced around the circumference of the bell jar 102; each such purge gas port 142 may be sized to have a cross-sectional area that is much less, e.g., an order of magnitude or more less, than the cross-sectional area of the purge gallery groove 134 (with such cross-sectional areas taken in planes perpendicular to the general direction of travel of gas flowing through the purge gas ports 142 or the purge gallery groove 134) and may have a first end that opens into the purge gallery groove 134 and a second end, opposite the first end, that opens into the perimeter plenum volume 132, so as to generate a back pressure within the purge gallery groove that causes the purge gas to be evenly distributed through all of the purge gas ports. In such implementations, the purge gallery groove 134 may be positioned outside an inner edge of the bell jar cover 138, such that the bottom surface of the bell jar cover 138 covers the purge gallery groove 134, and the purge gas ports 142 are positioned in the bell jar cover 138.

The purge gallery groove 134 may be fluidically connected with the purge gas inlet 124, which may be used to provide a purge gas that is inert or non-reactive to the processing gases that may be flowed through the vapor accumulator reservoir 100 (or that will not otherwise negatively affect semiconductor processing operations should the purge gas be drawn into the accumulator volume and/or vapor delivery lines 121 in small quantities through the main o-ring 108 or other seals). The purge gas may be flowed into the purge gallery groove 134 and then distributed, e.g., via the purge gas ports 142, into the perimeter plenum volume 132, where it may surround the exterior surface of the main o-ring 108 and displace any atmospheric or ambient air that may occupy the perimeter plenum volume. Thus, if there is leakage through the main o-ring 108 into the vapor accumulation volume 103, the gas that is drawn into the vapor accumulation volume 103 will be the purge gas instead of ambient air, thereby protecting the semiconductor processing operation from contamination or other adverse effects.

The flow of purge gas into the purge gallery groove 134 may be regulated so as to maintain the pressure of the purge gas within the purge gallery groove within a prescribed range, e.g., between about 50 torr and about 250 torr above atmospheric pressure; such regulation may be performed actively, e.g., using a pressure sensor and a valve to control purge gas flow to the purge gallery groove 134, or may be performed passively, e.g., through determining an average leak rate of the purge gas from the vapor accumulator reservoir 100 and then adjusting the flow of the purge gas to account for that leak rate. For example, the purge gas may leak out of the bell jar cover 138 via ports that are provided for thermocouples (which may be generally plugged with a thermocouple, but may not be a gas-tight interface) or via the interface between the bell jar cover 138 and the plate 110 (which may be a metal-to-metal contact interface that, while tightly engaged, may not be equipped with an actual seal and may therefore exhibit gas leakage).

In addition to the above-described features for providing purge gas to the main o-ring 108 on the first side 112 of the plate 110 via the perimeter plenum volume 132, the vapor accumulator reservoir 100 may also include additional features for also distributing the purge gas to elements or features located on the second side 114 of the plate 110. For example, each fluidic seal interface 118 may provide an additional potential leak path for atmospheric air to enter the processing gas flow from the vapor accumulator reservoir 100, e.g., by flowing into the vapor delivery lines 121 (where the leaking gas may then, depending on flow conditions, either flow back into the vapor accumulation volume 103 or into the semiconductor processing chamber that is supplied processing gas via the vapor delivery line 121).

To mitigate the effects of such potential leaks, vapor accumulator reservoirs such as those described herein may have additional features in the plate 110 to facilitate localized purging of each fluidic seal interface 118. For example, the purge gallery groove(s) may be fluidically connected with each fluidic seal interface 118 via a corresponding purge gas passage 123, each of which may have a purge gas outlet 122 that opens into an interface o-ring groove 160 for an interface o-ring 158 that may seal the fluidic seal interface 118; the purge gas passages 123 may also have corresponding purge gas inlets 124 that open into the purge gallery groove 134 to allow the purge gallery groove 134 to also pressurize the interface o-ring grooves 160 for the fluidic seal interfaces 118 with purge gas as well, thereby displacing any atmospheric air that may be adjacent the interface o-ring 158 seals and preventing such atmospheric air from potentially being drawn past the interface o-ring 158 seals and into the processing gas flow. The purge gas passages 123 are shown as located in the plate 110. In the depicted implementation, the purge gas passages 123 are provided by a hole drilled radially inward from the perimeter of the plate 110 that is then plugged with, for example, a set screw (as shown); the corresponding purge gas inlet and the purge gas outlet are then drilled into plate 110 from opposite sides so as to intersect with the purge gas passage 123.

In some implementations, the purge gas passage 123 may be provided by a hole drilled radially inward from and at an angle to the first side 112, intersecting the purge gallery groove 134 and the purge gas outlet 122. In such implementations there is no purge gas inlet 124, as the purge gas passage is directly connected to the purge gallery groove 134. In some implementations, the purge gas passage 123 may also be partially located in the bell jar cover 138.

In some implementations, the vapor delivery line 121 (or other gas flow components that may connect to the plate 110, such as a process gas inlet) may include a flange plate 156 that connects to the second side 114 of the plate 110 and the interface o-ring groove 160 may be located in the flange plate 156. In other implementations, the interface o-ring groove may be located in the second side 114 of the plate 110, or located partially in both the flange plate 156 and the second side 114. Regardless of in which part or parts the interface o-ring groove 160 is located, the purge gas outlet 122 for the corresponding fluidic seal interface 118 may be positioned so that there is generally free flow of purge gas from the purge gas outlet 122 into the interface o-ring groove 160, e.g., such that the purge gas outlet 122 overlaps with the interface o-ring groove 160 when viewed along a direction perpendicular to the second side 114 of the plate 110.

The fluidic seal interfaces 118 also each include a port 120 that extends through the plate 110; the port 120 is inside a perimeter of the main o-ring 108 such that it fluidically connects with the vapor accumulation volume 103. Thus, each fluidic seal interface 118 may include at least a corresponding port 120, purge gas outlet 122, and one or more mounting features, e.g., threaded studs, threaded holes, etc., to allow mounting of a fluid flow component such as the vapor delivery lines 121 to the fluidic seal interface. As discussed above, the fluidic seal interface 118 may also include an interface o-ring groove 160 (assuming it is machined into the plate 110 instead of, for example, a flange plate 156 or the like). In some implementations, the fluidic seal interface 118 may also include, for example, the flange plate 156, the interface o-ring groove 160, and the interface o-ring 158. In the implementation pictured, there are six fluidic seal interfaces 118—four for providing process gas to semiconductor processing chambers via vapor delivery lines 121, one for providing process gas to the vapor accumulator reservoir 100, and one for allowing monitoring access to the vapor accumulation volume 103, e.g., to allow a vapor concentration sensor to sample the gas within the vapor accumulation volume 103. It will be understood that any number of fluidic seal interfaces 118 may be provided.

Figure 4:
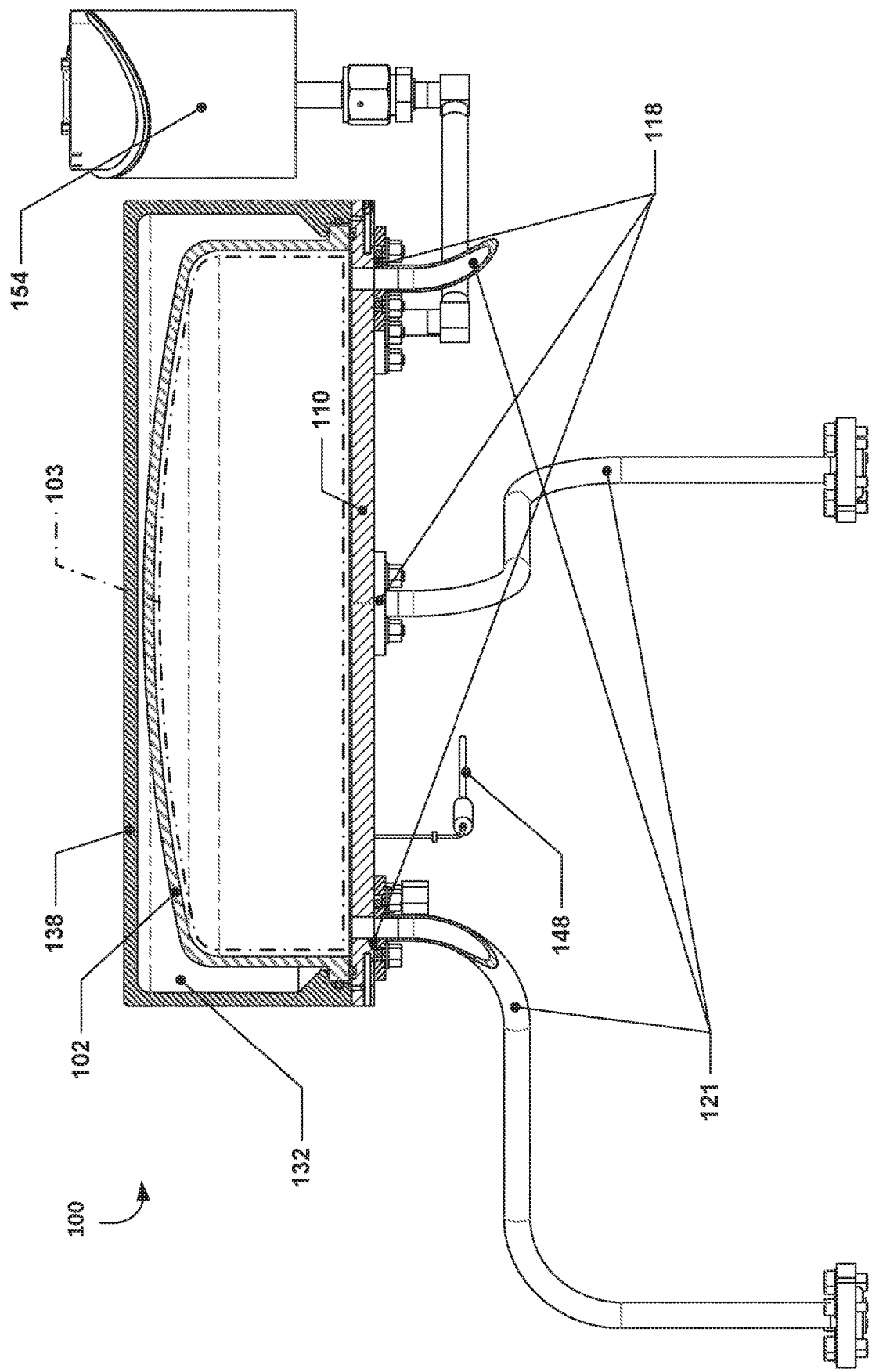
FIG. 4 depicts another cutaway view of the example vapor accumulator reservoir.

FIG. 4 is another cutaway view of the vapor accumulator reservoir 100. As can be seen, the plate 110 and bell jar 102 define a vapor accumulation volume 103. The interior surface of the bell jar cover 138, the exterior surface of the bell jar 102, and the plate 110 may partially define a perimeter plenum volume 132. The perimeter plenum volume may extend over the bell jar 102, encapsulating the bell jar 102. Vapor delivery lines 121 connect to the vapor accumulator reservoir 100 through fluidic seal interfaces 118 to deliver process gas to semiconductor processing stations (not shown). The vapor concentration sensor 154 may sense various properties of the process gas in the vapor accumulator reservoir. The thermocouple 148 is connected with the plate 110, and may be used to monitor the temperature of the plate 110.

Figure 5:
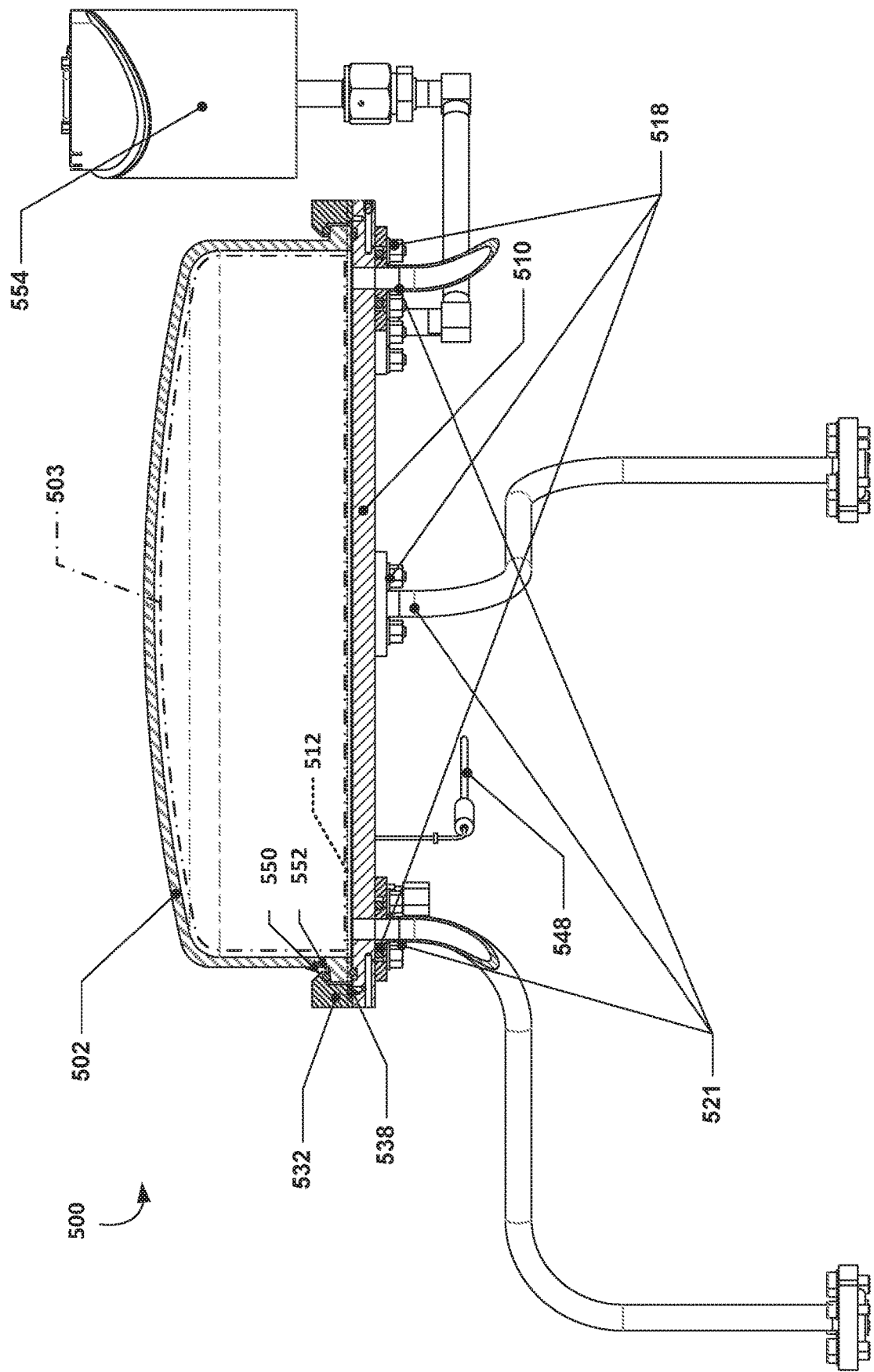
FIG. 5 depicts a cutaway view of another example vapor accumulator reservoir.

FIG. 5 is a cutaway view of a vapor accumulator reservoir 500 that does not have a bell jar cover. Vapor accumulator reservoir 500 has a plate 510 and a bell jar 502, which together may partially define a vapor accumulation volume 503. There is also a main o-ring that is sandwiched between the plate 510 and the bell jar 502 and contained within a main o-ring groove. Vapor delivery lines 521 and a vapor concentration sensor 554 may fluidically connect with the vapor accumulation volume 503 via fluidic seal interfaces 518.

In the implementation shown, the vapor accumulator reservoir 500 does not have a bell jar cover with an interior flange, but instead has a clamping structure 532. The bell jar cover may be replaced by a clamping structure to reduce the material cost or for other reasons. This may be especially useful if the bell jar is not made of a brittle material that has an increased chance of fracturing during operation.

In some implementations, clamping structure 532 may have a first surface that is proximate to a first side 512 of the plate 510, and a second surface that is proximate to an exterior flange of the bell jar 502. The first surface may interface with the plate 510 in the same manner as a bell jar cover would. In some implementations, the second surface may be proximate to the exterior flange of the bell jar 502 with a sufficient distance to prevent stress on the exterior flange.

In other implementations, there is a secondary o-ring groove 552 located partially in one or both of the second surface of the clamping structure 532 and the exterior flange of the bell jar 502, and a secondary o-ring 550 at least partially located in the secondary o-ring groove 552. When the clamping structure 532 is connected with the plate 510, the second surface of the clamping structure 532 may seal the secondary o-ring 550 against the exterior flange of the bell jar 502 in a similar manner as the main o-ring creates a seal between the bell jar 502 and the plate 510. This seal may create a perimeter plenum volume 538 that is defined by the first side 512, the main o-ring, the main o-ring groove, a third surface of the clamping structure that is between the first surface and the second surface, and a portion of the exterior flange of the bell jar 502. Inert or purge gas that is flowed into the perimeter plenum volume will be sealed by the secondary o-ring 552, rather than the interior surface of a bell jar cover.

As can be seen, and without providing specific callouts, the vapor accumulation reservoir 500 may, in some implementations, have a purge gallery groove and fluidic seal interfaces provided by a purge gas inlet, purge gas passage, and purge gas outlet. In some implementations, there is also an o-ring positioned between the bell jar 502 and the clamping structure 532 to provide a bumper effect and center the clamping structure over the bell jar 532 as described above. This may be in addition to the secondary o-ring 552 that seals the clamping structure against the exterior flange.

In some implementations, the plate and the bell jar may be made of corrosion resistant materials, although they need not be made of the same materials. The plate and the bell jar partially define the vapor accumulation volume, and are thus exposed to process gases that may be corrosive. Corrosion of the interior surface of the vapor accumulation volume may lead to contaminants in the process gas, and thus defects in the semiconductor wafers exposed to the process gas.

In some implementations, the plate and the bell jar may be made of one or more materials that are non-reactive to process gases that include chlorinated precursors, oxychlorides, fluorinated precursors, or oxyfluorides. As used herein, a non-reactive material may be completely non-reactive with the process gases that may flow through the vapor accumulator reservoir or substantially non-reactive, such that the particles that come from a reaction of the process gas and the non-reactive material do not cause defects in a processed semiconductor wafer. Non-reactive materials that may be used with chlorinated precursors, oxychlorides, fluorinated precursors, or oxyfluorides may include: quartz ($SiO_2$), quartz with a sapphire ($Al_2O_3$) coating, quartz with an alumina ($Al_2O_3$) coating, quartz with a yttria ($Y_2O_3$) coating, quartz with a yttria stabilized zirconia ($ZrO_2$) coating, quartz with a alumina/yttria laminate coating, borosilicate glass with a quartz coating, borosilicate glass with a sapphire coating, aluminum alloys such as 6061, 7075, or 3003 with an alumina coating, aluminum alloys such as 6061, 7075 or 3003 with a hard anodize ($Al_2O_3$) coating, aluminum alloys such as 6061, 7075, or 3003 with a electroless high phosphate nickel plating (NiP), aluminum alloys such as 6061, 7075, or 3003 with a polymer polytetrafluoroethylene (PTFE), perfluoroalkoxy (PFA), or parylene coating, stainless steel alloys such as 316 or 304 with a electroless high phosphate nickel plating (NiP), stainless steel alloys such as 316 or 304 with a polymer, PTFE, PFA, or parylene coating, corrosion resistant Ni-alloys, Hastelloy C-22, Hastelloy C-276, Hastelloy B-2, or Inconel 718. As discussed above, in some embodiments the plate may be made of a metal alloy material, which is generally easier to machine than a ceramic material.

In some implementations, the process gas may include brominated precursors, oxybromides, iodinated precursors, and/or oxyiodides. In such implementations the non-reactive materials listed above may be used with such compounds.

Figure 6:
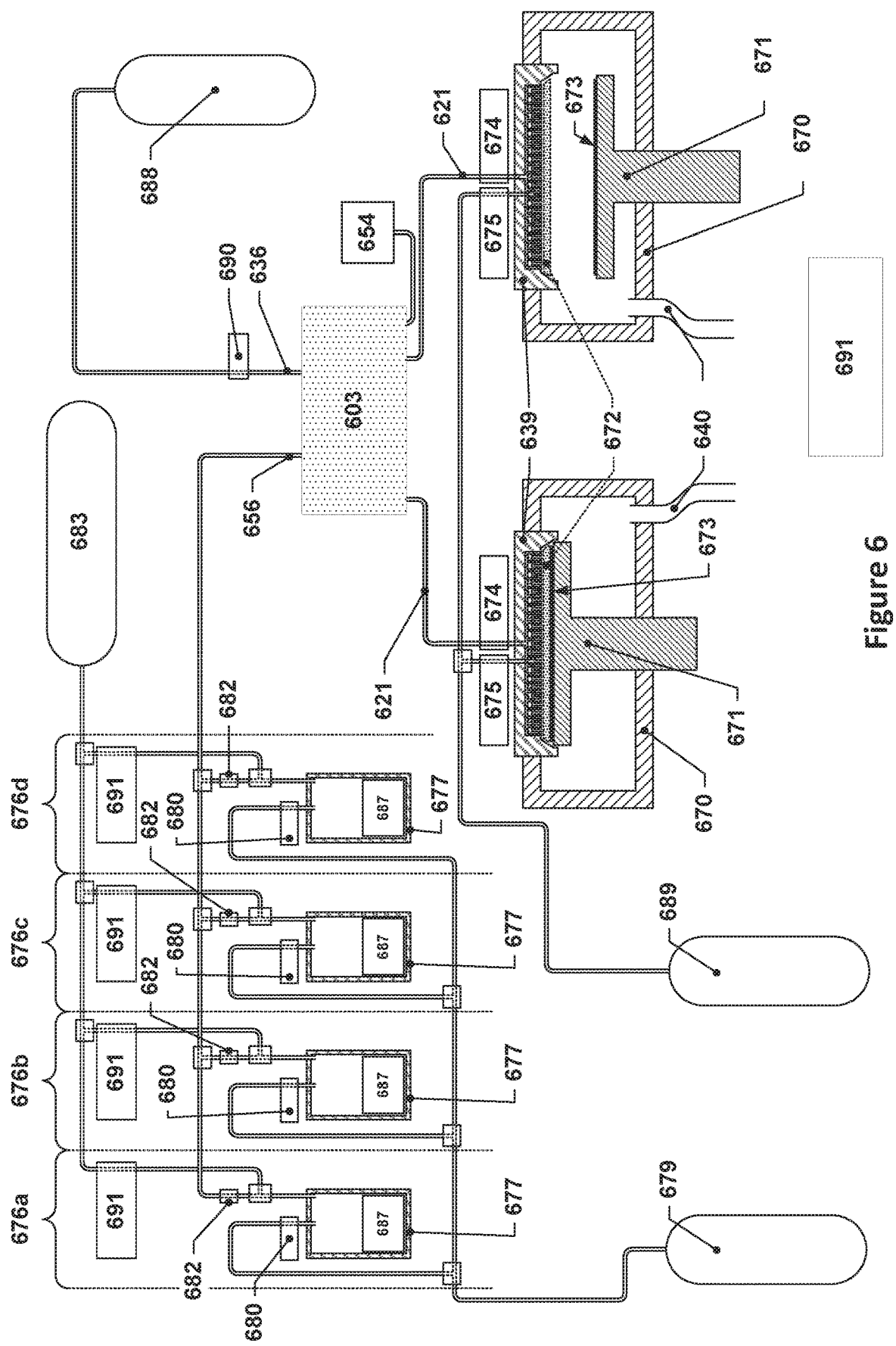
FIG. 6 depicts a high-level schematic of a semiconductor processing tool that incorporates a vapor accumulator reservoir.

FIG. 6 depicts a high-level schematic of a semiconductor processing tool that incorporates a vapor accumulator reservoir. The semiconductor processing tool of FIG. 6 is a multi-station ALD-type tool, although the vapor accumulator reservoir discussed herein may be used in other types of tools as well, including, for example, PECVD, CVD, or etch tools. In FIG. 6, two semiconductor processing chambers (also potentially referred to herein as "reactors," "reaction chambers," or "process chambers") 670 are shown—each process chamber 670 may include a pedestal 671 that supports a semiconductor wafer 673 during semiconductor processing operations. The pedestal 671 may be movable between multiple vertical elevations in order to facilitate loading/unloading or processing of the semiconductor wafer 673; the pedestal 671 in the rightmost process chamber 670 is in a lowered position, whereas the pedestal 671 in the leftmost process chamber 670 is in a raised position.

Each process chamber 670 may include a chamber lid 639 that may include a plurality of gas distribution passages that distribute process gases across the semiconductor wafer 673. In this example, each chamber lid 639 includes two sets of separate gas distribution passages, each one for distributing a different precursor gas. This prevents one precursor from mixing with the residue of the other precursor, as would occur if both precursors were to be flowed through the same passages—such mixing may result in chemical reactions occurring in locations other than on the semiconductor wafer 673, which may be undesirable. In some implementations, the gas distribution passages may be in a structure that is separate from the chamber lid 639, e.g., a showerhead-style gas distributor; it is to be understood that the concepts described herein may be utilized with either type of chamber lid 639 or gas distributor.

In systems such as ALD or ALE processing tools, a "microvolume" 672 may be formed within the process chamber during semiconductor processing operations. The microvolume 672 is formed between the pedestal 671 and the chamber lid 639/gas distributor when the pedestal 671 is in the position required for wafer processing; the chamber lid 639 or gas distributor may also have an annular wall that extends downward around the outer circumference of the pedestal 671, thereby defining a circumferential boundary to the microvolume. The microvolume is much smaller in volume than the overall volume of the process chamber 670, thereby allowing a smaller amount of precursor to be used—this allows for quicker dose delivery, quicker purges, less reactant waste, and various other benefits. The microvolume 672 may be thought of as the contiguous volume in between the surface through which gas is distributed across the semiconductor wafer 673 and the pedestal 671, and may terminate at the first major flow restriction beyond where the semiconductor wafer 673 is supported (where the first major flow restriction refers to a flow restriction large enough to prevent backflow of process gases into the microvolume during normal semiconductor processing operations). Process gases may be evacuated from the process chambers 670 by way of vacuum forelines 640, which may be fluidically connected to a vacuum pump (not shown).

The chamber lids 639 may each be supplied a first process gas containing a vapor from a vapor accumulation volume 603 provided by a vapor accumulator reservoir (not shown) such as those discussed herein. The first process gas may be supplied to each process chamber 670 from the vapor accumulation volume 603 by way of a corresponding vapor delivery line 621. The flow of the first process gas through each vapor delivery line 621 may be controlled by a corresponding first process gas dose valve 674 (or control valve assembly), which may also include a flow restrictor such that fluid flow through the vapor delivery line 621 is restricted to fully choked or sonic flow across the restrictor. Alternatively, the flow restrictor may be located elsewhere on the vapor delivery line 621.

The vapor accumulation volume may have a volume that is sufficiently large enough to allow each process chamber to be supplied with a single dose of vapor without affecting the ability of the vapor accumulator reservoir to provide single doses to the other process chambers. In some implementations, the volume vapor accumulation volume may be defined to satisfy the relationship:

$$V_p > \frac{600 n P_c V_m q}{20(P_p - P_c)}$$

where n=number of semiconductor processing chambers serviced by the vapor accumulator reservoir, $P_c$=average pressure in the microvolumes of those semiconductor processing chambers during atomic layer deposition operations, $V_m$=microvolume volume of each semiconductor processing chamber (assuming all semiconductor processing chambers are similarly designed), q=the number of microvolumes' worth of vapor delivered to a processing chamber's microvolume during a single dose, and $P_p$=peak pressure in the vapor accumulator reservoir during pulse delivery to a semiconductor processing chamber. Many of these parameters may vary depending on the particulars of the semiconductor manufacturing process that the vapor accumulator reservoir is intended to support, and vapor accumulation reservoirs may thus vary in size depending on those parameters.

The chamber lids may also each be supplied a second process gas, such as hydrogen, from a second process gas source 689, as well as other gases, such as a chemically inert purge gas (not shown, although may be delivered using a system similar to that used for the second process gas). The flow of the second process gas into each chamber lid 639 may be controlled by a corresponding second process gas dose valve 675.

As can be seen, the vapor accumulation volume 603 may be fluidically connected with a sensor 654. The sensor 654 may measure the vapor concentration in the vapor accumulation volume 603 and thereby allow determination of the vapor concentration in the vapor accumulation volume 603.

The vapor accumulation volume may, in some implementations, be in fluidic communication with a purge gas feed inlet 636 that is connected with a reservoir purge gas source 688. Flow of purge gas through the purge gas feed inlet 613 may be controlled, for example, by a reservoir purge gas valve 690 or other suitable control device. The purge gas may be added, if desired, to fill a perimeter plenum volume (not shown, but see earlier discussion and figures) at least partially surrounding the vapor accumulation volume 603.

The vapor accumulation volume 603 may be continuously replenished with vapor supplied from one or more vaporizers 676, such as vaporizers 676a/b/c/d, via vapor inlet 656. The vaporizers 676a/b/c/d may each include an ampoule 677 that may contain a reactant 687; carrier gas from a carrier gas source 679 may be selectively provided to each ampoule 677 by way of a corresponding carrier gas flow controller 680, which may control whether carrier gas is supplied to the corresponding ampoule 677 and at what flow rate, if so. As the carrier gas is flowed through one of the ampoules, which may be maintained at a specified pressure and temperature, the reactant 687 may evaporate into the carrier gas and be carried out of the ampoule towards a flow restrictor 682. Prior to reaching the flow restrictor 682, the reactant vapor and carrier gas mixture may be augmented by additional carrier gas supplied from an ampoule dilution gas source 683; the additional carrier gas flow for each ampoule 677 may be regulated by a corresponding ampoule dilution gas flow controller 691. This combined flow of carrier gas and vapor may then pass through the flow restrictor 682, which may be sized to induce sonic flow in the carrier gas/vapor flow during normal operating conditions involved with semiconductor processing operations. Such sonic flow may serve as a buffer that is immune to pressure fluctuations, even if relatively minute (such as on the order of 1 to 5 torr), in the vapor accumulator reservoir from affecting the pressure environment in the ampoules 677. It is to be understood that other types of vaporizers may be used with the vapor accumulator reservoir as well—the functionality provided by the vapor accumulator reservoir is not dependent on the type of vaporizer used. Other schemes with fewer ampoule dilution gas flow controllers 691 may also be used, e.g., one ampoule dilution gas flow controller 691 may be used to control the flow of dilution gas to multiple ampoules 677.

In some implementations, a controller 691 may be provided. The controller 691 may be part of a system that may include the above-described examples, and may be operatively connected with various valves, mass flow controllers, pumps, etc. so as to be able to receive information from and/or control such equipment. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of various gases, temperature settings (e.g., heating and/or cooling), pressure settings, vacuum settings, power settings, flow rate settings, fluid delivery settings, and positional and operation settings.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the phrase "one or more consecutive <items>," as used herein, is not only inclusive of instances in which there are multiple <items>, but is also inclusive of instances in which there is a single <item> (and thus technically no other <items> that would be considered to be "consecutive" with that single <item>). Put another way, the phrase "one or more consecutive <items>" should be understood to mean "a single <item> or two or more consecutive <items>." Similarly, the phrases "for each <item> of the one or more <items>" or "of each <item>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

The phrase "fluidically connected" is used herein to describe two volumes or components that are connected such that fluid may flow between them, much in the same sense that "electrically connected" may be used to describe two components that are connected together such that electricity can flow from one to the other.

Although the foregoing implementations have been described in some detail for purposes of clarity of understanding, it will be apparent that certain changes and modifications may be practiced within the scope of the appended claims. It should be noted that there are many alternative ways of implementing the processes, systems, and apparatus of the present implementations. Accordingly, the present implementations are to be considered as illustrative and not restrictive, and the implementations are not to be limited to the details given herein.

The various implementations described above may be provided through at least the following embodiments. While this listing of embodiments is considered within the scope of this disclosure, it will be understood that additional embodiments evident from the above discussion but not specifically listed below are also within the scope of this disclosure; the listing of embodiments below is not to be considered an exclusive listing of embodiments.

Embodiment 1

An apparatus, comprising: a bell jar having a bottom opening and one or more flange structures arranged around the bottom opening and extending radially outward therefrom; a plate, wherein: the plate has a first side and a second side opposite the first side, the bell jar is positioned with the bottom opening adjacent to the first side, and the plate includes one or more fluidic seal interfaces, each fluidic seal interface including at least one purge gas outlet located on the second side of the plate and fluidically connected, by a corresponding purge gas passage located within the plate, with a corresponding purge gas inlet located on the first side of the plate; one or more clamping structures having a bottom surface proximate to the first side of the plate and an interior flange extending radially inward therefrom and proximate to the one or more flange structures; a perimeter plenum volume defined, at least in part, by: a portion of the first side of the plate, a portion of each of the one or more clamping structures, and at least a portion of each of the one or more flange structures; and one or more purge gallery grooves located in one or more items selected from the group consisting of: the plate and the one or more clamping structures, the one or more purge gallery grooves fluidically connected with the perimeter plenum volume and with each purge gas inlet within the apparatus.

Embodiment 2

An apparatus, comprising: a bell jar having a bottom opening, one or more flange structures arranged around the bottom opening and extending radially outward therefrom, and a seal surface; a main o-ring; a plate, wherein: the plate has a first side and a second side opposite the first side, the bell jar is positioned with the seal surface adjacent to the first side, a main o-ring groove is located in one or more items selected from the group consisting of: the first side of the plate and the seal surface of the bell jar, the main o-ring is positioned at least partially within the main o-ring groove and is sandwiched between the seal surface of the bell jar and the first side of the plate, the plate includes one or more fluidic seal interfaces, each fluidic seal interface including i) a port located inside of an interior perimeter of the main o-ring and extending through the plate from the first side to the second side and ii) at least one purge gas outlet located on the second side of the plate and fluidically connected, by a corresponding purge gas passage located within the plate, with a corresponding purge gas inlet located on the first side of the plate; one or more clamping structures having a bottom surface proximate to the first side of the plate and an interior flange extending radially inward therefrom and proximate to the one or more flange structures; a perimeter plenum volume defined, at least in part, by: the main o-ring, a portion of the main o-ring groove, a portion of the first side of the plate, a portion of the seal surface, and at least a portion of each of the one or more flange structures between the interior flange of the one or more clamping structures and the seal surface; one or more purge gallery grooves a) located in one or more items selected from the group consisting of: the plate and the one or more clamping structures, and b) arranged around the main o-ring groove, the one or more purge gallery grooves fluidically connected with the perimeter plenum volume and with each purge gas inlet within the apparatus; and a purge gas feed inlet fluidically connected with the one or more purge gallery grooves.

Embodiment 3

The apparatus of either embodiment 1 or embodiment 2, further comprising: a bell jar cover having a bottom opening and a bottom surface, wherein: the bottom surface of the bell jar cover is proximate to the first side of the first plate, the bell jar is contained within a volume defined, at least in part, by the first side of the plate and an interior surface of the bell jar cover, and the perimeter plenum volume is additionally defined, at least in part, by the interior surface of the bell jar cover and an exterior surface of the bell jar.

Embodiment 4

The apparatus of any of embodiments 1 through 3, wherein the one or more clamping structures are part of the bell jar cover, wherein: the bottom surface of the one or more clamping structures is the bottom surface of the bell jar cover, and the interior flange of the one or more clamping structures is an interior flange of the bell jar cover.

Embodiment 5

The apparatus of any of embodiments 1 through 4, wherein: the bell jar cover has an inner edge of the bottom surface proximate to the first side of the plate, the one or more purge gallery grooves are located outside of the inner edge, and the bell jar cover has a plurality of purge gas ports connecting the one or more purge gallery grooves with the perimeter plenum volume.

Embodiment 6

The apparatus of embodiment 5, wherein the plurality of purge gas ports have a cross-sectional area less than about 10% of a cross-sectional area of the purge gallery groove in a plane that is perpendicular to a path followed by the purge gallery groove.

Embodiment 7

The apparatus of any of embodiments 3 through 6, wherein the one or more clamping structures are provided by an interior flange that extends around the perimeter of the bottom opening of the bell jar cover.

Embodiment 8

The apparatus of any of embodiments 1 through 7, further comprising one or more heating elements proximate to the second side of the plate.

Embodiment 9

The apparatus of any of embodiments 1 through 8, further comprising one or more temperature sensor devices, each temperature sensor device in contact with an item selected from the group consisting of: the bell jar, the plate, and one of the one or more fluidic seal interfaces.

Embodiment 10

The apparatus of any of embodiments 1 through 9, wherein the one or more flange structures is a single flange structure.

Embodiment 11

The apparatus of any of embodiments 1 through 10, wherein the one or more clamping structures is a single clamping structure.

Embodiment 12

The apparatus of embodiment 11, wherein: the one or more flange structures is a single flange structure, and the apparatus further comprises: a secondary o-ring; a secondary o-ring groove located in one or more items selected from the group consisting of: the single flange structure and the single clamping structure, wherein the secondary o-ring is positioned at least partially within the secondary o-ring groove and is radially interposed between the single flange structure and the second surface of the single clamping structure.

Embodiment 13

The apparatus of any of embodiments 1 through 12, wherein there are six fluidic seal interfaces.

Embodiment 14

The apparatus of any of embodiments 2 through 13, wherein the main o-ring groove is located in the plate.

Embodiment 15

The apparatus of any of embodiments 1 through 14, wherein each fluidic seal interface includes a flange plate, an interface o-ring, and an interface o-ring groove located in one or more items selected from the group consisting of: the flange plate and the second side of the plate.

Embodiment 16

The apparatus of any of embodiments 1 through 15, further comprising a vapor accumulation volume defined, at least in part, by: an interior surface of the bell jar, the main o-ring, and the first side of the plate.

Embodiment 17

The apparatus of embodiment 16, further comprising: a pump fluidically connected with the bell jar volume, a controller that includes one or more processors and one or more memory devices, wherein: the one or more processors, the one or more memory devices, and the pump are operably connected with each other, and the one or more memory devices store computer-executable instructions for controlling the one or more processors to cause the pump to reduce the absolute pressure in the bell jar volume to a level of less than 10 torr to 200 torr.

Embodiment 18

The apparatus of any of embodiments 1 through 17, wherein the purge gas feed inlet is connected with a gas supply comprising an inert gas.

Embodiment 19

The apparatus of embodiment 18, wherein the inert gas comprises one or more of argon, helium, nitrogen, and neon.

Embodiment 20

The apparatus of any of embodiments 1 through 19, further comprising a secondary o-ring positioned at least partially between the one or more flange structures and the one or more clamping structures.

Embodiment 21

The apparatus of any of embodiments 1 through 20, wherein the main o-ring includes a flat, annular section that extends radially inward from a toroidal section.

Embodiment 22

The apparatus of any of embodiments 1 through 3 or 7 through 21, further comprising a plurality of purge gas ports connecting the one or more purge gallery grooves with the perimeter plenum volume, wherein each of the plurality of purge gas ports have a cross-sectional area less than about 10% of a cross-sectional area of the purge gallery groove in a plane that is perpendicular to a path followed by the purge gallery groove.

Embodiment 23

The apparatus of any of embodiments 1 through 22, wherein the one or more purge gallery grooves are provided by a single purge gallery groove.

Embodiment 24

The apparatus of embodiment 23, wherein the single purge gallery groove forms a complete loop around the main o-ring groove.

Embodiment 25

The apparatus of any of embodiments 1 through 24, wherein one or more of the one or more fluidic seal interfaces are connected with a gas supply source.

Embodiment 26

The apparatus of any of embodiments 1 through 25, wherein one or more of the one or more fluidic seal interfaces are outlet interfaces for distributing gas.

Embodiment 27

The apparatus of any of embodiments 1 through 26, wherein the bell jar is non-reactive to chlorine-containing compounds.

Embodiment 28

The apparatus of any of embodiments 1 through 27, wherein the bell jar is non-reactive to fluorine-containing compounds.

Embodiment 29

The apparatus of any of embodiments 1 through 28, wherein the plate is non-reactive to chlorine-containing compounds.

Embodiment 30

The apparatus of any of embodiments 1 through 29, wherein the plate is non-reactive to fluorine-containing compounds.

Embodiment 31

The apparatus of any of embodiments 1 through 30, wherein the bell jar includes one or more materials selected from the group consisting of: quartz ($SiO_2$), quartz with a sapphire ($Al_2O_3$) coating, quartz with an alumina ($Al_2O_3$) coating, quartz with a yttria ($Y_2O_3$) coating, quartz with a yttria-stabilized zirconia ($ZrO_2$) coating, quartz with a alumina/yttria laminate coating, borosilicate glass with a quartz coating, borosilicate glass with a sapphire coating, aluminum alloy, aluminum 6061 with an alumina coating, aluminum 7075 with an alumina coating, or aluminum 3003 with an alumina coating, aluminum alloy with a hard anodize (Al$_2$O$_3$) coating, aluminum 6061 with a hard anodize coating, aluminum 7075 with a hard anodize coating, or aluminum 3003 with a hard anodize coating, aluminum alloy with an electroless high phosphate nickel plating (NiP), aluminum 6061 with an electroless high phosphate nickel plating, aluminum 7075 with an electroless high phosphate nickel plating, or aluminum 3003 with an electroless high phosphate nickel plating, aluminum alloy with a polymer polytetrafluoroethylene (PTFE), perfluoroalkoxy (PFA), or parylene coating, aluminum 6061 with a polymer polytetrafluoroethylene, perfluoroalkoxy, or parylene coating, aluminum 7075 with a polymer polytetrafluoroethylene, perfluoroalkoxy, or parylene coating, or aluminum 3003 with a polymer polytetrafluoroethylene, perfluoroalkoxy, or parylene coating, stainless steel alloy with a electroless high phosphate nickel plating, stainless 316 with a electroless high phosphate nickel plating, or stainless 304 with a electroless high phosphate nickel plating, stainless steel alloy with a polymer, PTFE, PFA, or parylene coating, stainless 316 with a polymer, PTFE, PFA, or parylene coating, or stainless 304 with a polymer, PTFE, PFA, or parylene coating, corrosion resistant Ni-alloys, Hastelloy C-22, Hastelloy C-276, Hastelloy B-2, and Inconel 718.

Embodiment 32

The apparatus of any of embodiments 1 through 31, wherein the plate includes one or more materials selected from the group consisting of: aluminum alloy, aluminum 6061 with an alumina coating, aluminum 7075 with an alumina coating, or aluminum 3003 with an alumina coating, aluminum alloy with a hard anodize (Al$_2$O$_3$) coating, aluminum 6061 with a hard anodize coating, aluminum 7075 with a hard anodize coating, or aluminum 3003 with a hard anodize coating, aluminum alloy with an electroless high phosphate nickel plating (NiP), aluminum 6061 with an electroless high phosphate nickel plating, aluminum 7075 with an electroless high phosphate nickel plating, or aluminum 3003 with an electroless high phosphate nickel plating, aluminum alloy with a polymer polytetrafluoroethylene (PTFE), perfluoroalkoxy (PFA), or parylene coating, aluminum 6061 with a polymer polytetrafluoroethylene, perfluoroalkoxy, or parylene coating, aluminum 7075 with a polymer polytetrafluoroethylene, perfluoroalkoxy, or parylene coating, or aluminum 3003 with a polymer polytetrafluoroethylene, perfluoroalkoxy, or parylene coating, stainless steel alloy with a electroless high phosphate nickel plating, stainless 316 with a electroless high phosphate nickel plating, or stainless 304 with a electroless high phosphate nickel plating, stainless steel alloy with a polymer, PTFE, PFA, or parylene coating, stainless 316 with a polymer, PTFE, PFA, or parylene coating, or stainless 304 with a polymer, PTFE, PFA, or parylene coating, corrosion resistant Ni-alloys, Hastelloy C-22, Hastelloy C-276, Hastelloy B-2, and Inconel 718.

The invention claimed is:

1. An apparatus, comprising:
   a bell jar having a bottom opening, one or more flange structures arranged around the bottom opening and extending radially outward therefrom, and a seal surface;
   a main o-ring;
   a plate, wherein:
   the plate has a first side and a second side opposite the first side,
   the bell jar is positioned with the seal surface adjacent to the first side,
   a main o-ring groove is located in one or more items selected from the group consisting of: the first side of the plate and the seal surface of the bell jar,
   the main o-ring is positioned at least partially within the main o-ring groove and is sandwiched between the seal surface of the bell jar and the first side of the plate,
   the plate includes one or more fluidic seal interfaces, each fluidic seal interface including i) a port located inside of an interior perimeter of the main o-ring and extending through the plate from the first side to the second side and ii) at least one purge gas outlet located on the second side of the plate and fluidically connected, by a corresponding purge gas passage located within the plate, with a corresponding purge gas inlet located on the first side of the plate;
   one or more clamping structures having a bottom surface proximate to the first side of the plate and an interior flange extending radially inward therefrom and proximate to the one or more flange structures;
   a perimeter plenum volume defined, at least in part, by:
   the main o-ring,
   a portion of the main o-ring groove,
   a portion of the first side of the plate,
   a portion of the seal surface, and
   at least a portion of each of the one or more flange structures between the interior flange of the one or more clamping structures and the seal surface;
   one or more purge gallery grooves a) located in one or more items selected from the group consisting of: the plate and the one or more clamping structures, and b) arranged around the main o-ring groove, the one or more purge gallery grooves fluidically connected with the perimeter plenum volume and with each purge gas inlet within the apparatus; and
   a purge gas feed inlet fluidically connected with the one or more purge gallery grooves.

2. An apparatus, comprising:
   a bell jar having a bottom opening and one or more flange structures arranged around the bottom opening and extending radially outward therefrom;
   a plate, wherein:
   the plate has a first side and a second side opposite the first side,
   the bell jar is positioned with the bottom opening adjacent to the first side, and
   the plate includes one or more fluidic seal interfaces, each fluidic seal interface including at least one purge gas outlet located on the second side of the plate and fluidically connected, by a corresponding purge gas passage located within the plate, with a corresponding purge gas inlet located on the first side of the plate;
   one or more clamping structures having a bottom surface proximate to the first side of the plate and an interior flange extending radially inward therefrom and proximate to the one or more flange structures;
   a perimeter plenum volume defined, at least in part, by:
   a portion of the first side of the plate, a portion of each of the one or more clamping structures, and
   at least a portion of each of the one or more flange structures; and
   one or more purge gallery grooves located in one or more items selected from the group consisting of: the plate and the one or more clamping structures, wherein the one or more purge gallery grooves are fluidically connected with the perimeter plenum volume and with each purge gas inlet within the apparatus.

3. The apparatus of claim 2, further comprising:
a bell jar cover having a bottom opening and a bottom surface, wherein:
the bottom surface of the bell jar cover is proximate to the first side of the plate,
the bell jar is contained within a volume defined, at least in part, by the first side of the plate and an interior surface of the bell jar cover, and
the perimeter plenum volume is additionally defined, at least in part, by the interior surface of the bell jar cover and an exterior surface of the bell jar.

4. The apparatus of claim 3, wherein the one or more clamping structures are part of the bell jar cover, wherein:
the bottom surface of the one or more clamping structures is the bottom surface of the bell jar cover, and
the interior flange of the one or more clamping structures is an interior flange of the bell jar cover.

5. The apparatus of claim 3, wherein:
the bell jar cover has an inner edge of the bottom surface proximate to the first side of the plate,
the one or more purge gallery grooves are located outside of the inner edge, and
the bell jar cover has a plurality of purge gas ports connecting the one or more purge gallery grooves with the perimeter plenum volume.

6. The apparatus of claim 5, wherein the plurality of purge gas ports have a cross-sectional area less than about 10% of a cross-sectional area of each of the one or more purge gallery grooves in a plane that is perpendicular to a path followed by the purge gallery groove.

7. The apparatus of claim 3, wherein the one or more clamping structures are provided by an interior flange that extends around the perimeter of the bottom opening of the bell jar cover.

8. The apparatus of claim 2, further comprising one or more items selected from the group consisting of: one or more heating elements proximate to the second side of the plate and one or more temperature sensor devices, wherein each temperature sensor device in contact with an item selected from the group consisting of: the bell jar, the plate, and one of the one or more fluidic seal interfaces.

9. The apparatus of claim 2, wherein:
the one or more clamping structures is a single clamping structure,
the one or more flange structures is a single flange structure, and
the apparatus further comprises:
a secondary o-ring; and
a secondary o-ring groove located in one or more items selected from the group consisting of: the single flange structure and the single clamping structure, wherein the secondary o-ring is positioned at least partially within the secondary o-ring groove and is radially interposed between the single flange structure and the single clamping structure.

10. The apparatus of claim 2, wherein there are six fluidic seal interfaces.

11. The apparatus of claim 2, further comprising a main o-ring groove located in one or more items selected from the group consisting of: the first side of the plate and a bottom surface of the bell jar.

12. The apparatus of any of claim 11, further comprising a main o-ring within the main o-ring groove, wherein the main o-ring includes a flat, annular section that extends radially inward from a toroidal section.

13. The apparatus of claim 12, further comprising a vapor accumulation volume defined, at least in part, by:
an interior surface of the bell jar,
the main o-ring, and
the first side of the plate.

14. The apparatus of claim 13, further comprising:
a pump fluidically connected with the vapor accumulation volume,
a controller that includes one or more processors and one or more memory devices, wherein:
the one or more processors, the one or more memory devices, and the pump are operably connected with each other, and
the one or more memory devices store computer-executable instructions for controlling the one or more processors to cause the pump to reduce an absolute pressure in the vapor accumulation volume to a level of less than 10 torr to 200 torr.

15. The apparatus of claim 2, further comprising a plurality of purge gas ports connecting the one or more purge gallery grooves with the perimeter plenum volume, wherein each of the plurality of purge gas ports has a cross-sectional area less than about 10% of a cross-sectional area of each of the one or more purge gallery grooves in a plane that is perpendicular to a path followed by the purge gallery groove.

16. The apparatus of claim 2, wherein the one or more purge gallery grooves are provided by a single purge gallery groove.

17. The apparatus of claim 16, wherein the single purge gallery groove forms a complete loop around a main o-ring groove, wherein the main o-ring groove is located in one or more items selected from the group consisting of: the first side of the plate and a seal surface of the bell jar.

18. The apparatus of claim 2, wherein each fluidic seal interface includes a flange plate, an interface o-ring, and an interface o-ring groove located in one or more items selected from the group consisting of: the flange plate and the second side of the plate.

19. The apparatus of claim 2, further comprising a purge gas feed inlet fluidically connected with the one or more purge gallery grooves and with a gas supply comprising an inert gas, wherein the inert gas comprises one or more of argon, helium, nitrogen, and neon.

20. The apparatus of claim 2, wherein one or more of the one or more fluidic seal interfaces are connected with a gas supply source.

21. The apparatus of claim 2, wherein one or more of the one or more fluidic seal interfaces are outlet interfaces for distributing gas.

22. The apparatus of claim 2, wherein the bell jar, the plate, or the bell jar and the plate a) are one or more of: non-reactive to chlorine-containing compounds and non-reactive to fluorine-containing compounds, and b) include one or more materials selected from the group consisting of: quartz ($SiO_2$), quartz with a sapphire ($Al_2O_3$) coating, quartz with an alumina ($Al_2O_3$) coating, quartz with a yttria ($Y_2O_3$) coating, quartz with a yttria-stabilized zirconia ($ZrO_2$) coating, quartz with a alumina/yttria laminate coating, borosilicate glass with a quartz coating, borosilicate glass with a sapphire coating, aluminum alloy, aluminum 6061 with an alumina coating, aluminum 7075 with an alumina coating, or aluminum 3003 with an alumina coating, aluminum alloy with a hard anodize ($Al_2O_3$) coating, aluminum 6061 with a hard anodize coating, aluminum 7075 with a hard anodize coating, or aluminum 3003 with a hard anodize coating, aluminum alloy with an electroless high phosphate nickel plating (NiP), aluminum 6061 with an electroless high phosphate nickel plating, aluminum 7075 with an electroless high phosphate nickel plating, or aluminum 3003 with an electroless high phosphate nickel plating, aluminum alloy with a polymer polytetrafluoroethylene (PTFE), perfluoroalkoxy (PFA), or parylene coating, aluminum 6061 with a polymer polytetrafluoroethylene, perfluoroalkoxy, or parylene coating, aluminum 7075 with a polymer polytetrafluoroethylene, perfluoroalkoxy, or parylene coating, or aluminum 3003 with a polymer polytetrafluoroethylene, perfluoroalkoxy, or parylene coating, stainless steel alloy with a electroless high phosphate nickel plating, stainless 316 with a electroless high phosphate nickel plating, or stainless 304 with a electroless high phosphate nickel plating, stainless steel alloy with a polymer, PTFE, PFA, or parylene coating, stainless 316 with a polymer, PTFE, PFA, or parylene coating, or stainless 304 with a polymer, PTFE, PFA, or parylene coating, corrosion resistant Ni-alloys, Hastelloy C-22, Hastelloy C-276, Hastelloy B-2, and Inconel 718.

\* \* \* \* \*